US009185412B2

(12) United States Patent
Demos

(10) Patent No.: US 9,185,412 B2
(45) Date of Patent: Nov. 10, 2015

(54) SIGNAL TO NOISE IMPROVEMENT

(71) Applicant: Gary Demos, Perris, CA (US)

(72) Inventor: Gary Demos, Perris, CA (US)

(*) Notice: Subject to any disclaimer, the term of this patent is extended or adjusted under 35 U.S.C. 154(b) by 0 days.

(21) Appl. No.: 14/189,424

(22) Filed: Feb. 25, 2014

(65) Prior Publication Data
US 2014/0177972 A1 Jun. 26, 2014

Related U.S. Application Data

(62) Division of application No. 13/772,262, filed on Feb. 20, 2013, now Pat. No. 8,666,184, and a division of application No. 13/024,242, filed on Feb. 9, 2011, now Pat. No. 8,401,315, and a division of application No. 11/225,665, filed on Sep. 12, 2005, now Pat. No. 7,916,952.

(51) Int. Cl.
*G06K 9/46* (2006.01)
*H04N 19/85* (2014.01)
(Continued)

(52) U.S. Cl.
CPC ........... *H04N 19/00903* (2013.01); *H03M 7/24* (2013.01); *H04N 19/00006* (2013.01); *H04N 19/124* (2014.11); *H04N 19/162* (2014.11);
(Continued)

(58) Field of Classification Search
CPC .................... H04N 19/00903; H04N 7/26244; H04N 7/02; H04N 7/26; H04N 7/26579; H04N 7/26393; H04N 7/2651; H04N 11/02; H04N 19/31; H04N 19/503; H04N 19/80; H04N 19/00006; H04B 1/66; G06T 9/007; G06F 15/16; G06F 15/173
See application file for complete search history.

(56) References Cited

U.S. PATENT DOCUMENTS 5,250,948 A    10/1993  Berstein et al.
5,253,058 A *  10/1993  Gharavi ............... 375/240.12
(Continued)

FOREIGN PATENT DOCUMENTS

WO      9222166 A     12/1992
WO      03065732 A     8/2003

OTHER PUBLICATIONS

International Search Report dated Jul. 19, 2006 for corresponding PCT patent application serial No. PCT/US2005/032428.
(Continued)

*Primary Examiner* — Amir Alavi
(74) *Attorney, Agent, or Firm* — Jaquez Land Richman LLP; John Land, Esq.

(57) ABSTRACT

Systems, methods, and processor executable code for high quality wide-range multi-layer image compression of a sequence of video images. A computer-implemented method of adding signal-to-noise improvement layers which are targeted to specific aspects of a sequence of images. The method comprises selecting one or more aspects of a coded image to improve, isolating those image aspects using the selection criteria, and coding a signal-to-noise layer using the isolated coded image aspects. A computer-implemented method for generating a signal-to-noise correction layer from a digitized video image represented as pixels. The method comprises quantizing and dequantizing the digitized video image to create a coded image, subtracting the coded image from the digitized video image to create a signal-to-noise difference image represented as pixels, and applying one or both of quantization weighting and pixel weighting to the signal-to-noise difference image pixel values such that larger difference image pixel values have smaller quantized values.

15 Claims, 9 Drawing Sheets

(51) Int. Cl.

| | | |
|---|---|---|
| *H04N 19/10* | (2014.01) | |
| *H03M 7/24* | (2006.01) | |
| *H04N 19/63* | (2014.01) | |
| *H04N 19/61* | (2014.01) | |
| *H04N 19/124* | (2014.01) | |
| *H04N 19/162* | (2014.01) | |
| *H04N 19/17* | (2014.01) | |
| *H04N 19/187* | (2014.01) | |
| *H04N 19/635* | (2014.01) | |
| *H04N 19/29* | (2014.01) | |
| *H04N 19/115* | (2014.01) | |
| *H04N 19/146* | (2014.01) | |

(52) U.S. Cl.
CPC ............. *H04N 19/17* (2014.11); *H04N 19/187* (2014.11); *H04N 19/29* (2014.11); *H04N 19/61* (2014.11); *H04N 19/63* (2014.11); *H04N 19/635* (2014.11); *H04N 19/85* (2014.11); *H04N 19/115* (2014.11); *H04N 19/146* (2014.11)

(56) References Cited

U.S. PATENT DOCUMENTS

| | | | |
|---|---|---|---|
| 5,414,469 A | 5/1995 | Gonzales et al. | |
| 5,444,575 A | 8/1995 | Augenbraun et al. | |
| 5,923,814 A | 7/1999 | Boyce | |
| 6,351,491 B1 | 2/2002 | Lee et al. | |
| 6,549,674 B1 | 4/2003 | Chui et al. | |
| 6,885,395 B1 | 4/2005 | Rabbani et al. | |
| 6,969,092 B2 | 11/2005 | MacWilliams et al. | |
| 7,171,626 B2 | 1/2007 | Sheldon et al. | |
| 7,406,596 B2 | 7/2008 | Tararukhina et al. | |
| 7,751,070 B2 | 7/2010 | Sato | |
| 7,881,544 B2 | 2/2011 | Bashyam et al. | |
| 7,916,952 B2 * | 3/2011 | Demos .......................... | 382/232 |
| 8,315,308 B2 * | 11/2012 | Bao et al. ................. | 375/240.12 |
| 8,369,235 B2 * | 2/2013 | Kim et al. ..................... | 370/252 |
| 8,401,315 B2 * | 3/2013 | Demos ......................... | 382/232 |
| 8,666,184 B2 * | 3/2014 | Demos ......................... | 382/240 |
| 8,848,787 B2 * | 9/2014 | Karczewicz et al. .... | 375/240.03 |
| 2002/0057850 A1 | 5/2002 | Sirohey et al. | |
| 2002/0064227 A1 * | 5/2002 | Van Der Schaar et al. ........................ | 375/240.11 |
| 2002/0154693 A1 | 10/2002 | Demos et al. | |
| 2004/0001547 A1 * | 1/2004 | Mukherjee ............... | 375/240.16 |
| 2005/0091051 A1 | 4/2005 | Moriya et al. | |
| 2006/0071825 A1 | 4/2006 | Demos | |
| 2006/0230162 A1 * | 10/2006 | Chen et al. ..................... | 709/229 |
| 2007/0160305 A1 | 7/2007 | Demos | |
| 2011/0194600 A1 | 8/2011 | Demos | |
| 2014/0177972 A1 * | 6/2014 | Demos .......................... | 382/240 |
| 2014/0192865 A1 * | 7/2014 | Zhang et al. ............. | 375/240.12 |
| 2015/0103900 A1 * | 4/2015 | Liu et al. .................. | 375/240.12 |

OTHER PUBLICATIONS

Majid Rabbani and Rajan Joshi, et al. An overview of the JPEG2000 Still Image Compression Standard—Rev. 1:, JPEG Conference, Crowborough: JPEG Forum Ltd., GB, Jul. 19, 2001, paragraph [02.2]; pp. 1-46.

Kingsbury N. ED, Institute of Electrical and Electronics Engineers: Design of Q-shift Complex Wavelets for Image Processing . . . , Barcelona, Spain, Sep. 14-17, 2003, Int'l Conference . . . NY, NY, IEEE, US, vol. 2 of 3, Sep. 14, 2003, pp. 1013-1016.

Wohlberg, et al., "Extending the JPEG 2000 Image Coding Standard to Support Floating Point Data," ISO/IEC JTC1/SC29/WG1 Document #3020, Jul. 2, 2003, Strasbourg, France.

Gamito, et al., "Lossless Coding of Floating Point Data with JPEG 2000, Part 10", JPEG 2000 Theory and Applications Special Session of the 49th SPIE Annual Meeting, Aug. 2, 2004, Denver, Colorado.

ADETTI/ISCTE JPEG, "Lossless Coding of Floating Point IEEE754 Data," JPEG Conference, Browborough, JPEG Forum, Ltd., Mar. 31, 2004.

* cited by examiner

Sharpness Target (anything within the image that is sharp)

800

Folder Stem_MMR3_mc_bits
   File header_frame_1.bits
   File header_frame_n.bits
   ...
   Folder low_low_floating_point
      File frame_1_low_low.exr
      File frame_2_low_low.exr
      ...
   Folder quantization_scale
      File frame_1_quant.exrz
      File frame_2_quant.exr
      ...
   Folder level_4_hi_bands
      File frame_1_level_4_hi_bands.bits
      File frame_2_level_4_hi_bands.bits
      ...
   Folder level_3_hi_bands
      File frame_1_level_3_hi_bands.bits
      File frame_2_level_3_hi_bands.bits
      ...
   Folder level_2_hi_bands
      File frame_1_level_2_hi_bands.bits
      File frame_2_level_2_hi_bands.bits
      ...
   Folder level_1_hi_bands
      File frame_1_level_1_hi_bands.bits
      File frame_2_level_1_hi_bands.bits
      ...
   Folder level_0_all_bands_SNR
      File frame_1_level0_all_bands_SNR.bits
      File frame_2_level0_all_bands_SNR.bits
      ...
   Folder level_0_quantization_scale
      File frame_1_level0_quantization_scale.exr
      File frame_2_level0_quantization_scale.exr
      ...
   Folder motion_compensation
      [no file for intra frame 1]
      File frame_2_motion_compensation.bits
      File frame_3_motion_compensation.bits
      ...
   Folder level_2x_hi_bands
      File frame_1_2x_hi_bands.bits
      File frame_2_2x_hi_bands.bits
      ...
   Folder level_2x_low_low_band
      File frame_1_2x_low_low_bands.bits
      File frame_2_2x_low_low_bands.bits
      ...
   Folder level_full_reso_hi_bands
      File frame_1_full_reso_hi_bands.bits
      File frame_2_full_reso_hi_bands.bits
      ...
   Folder level_full_reso_low_low_band
      File frame_1_full_reso_low_low_band.bits
      File frame_2_full_reso_low_low_band.bits
      ...
   Folder level_SNR_1_all_bands
      File frame_1_SNR_1_all_bands.bits
      File frame_2_SNR_1_all_bands.bits
      ...
   Folder level_SNR_2_all_bands
      File frame_1_SNR_2_all_bands.bits
      File frame_2_SNR_2_all_bands.bits
      ...
   Folder level_SNR_3_all_bands
      File frame_1_SNR_3_all_bands.bits
      File frame_2_SNR_3_all_bands.bits
      ...

*Fig. 8*

SIGNAL TO NOISE IMPROVEMENT

RELATED APPLICATIONS

This application is a divisional application of application Ser. No. 13/772,262, filed Feb. 20, 2013, now U.S. Pat. No. 8,666,184 which is a divisional application of application Ser. No. 13/024,242, filed Feb. 9, 2011, now U.S. Pat. No. 8,401,315, which is a divisional application of Ser. No. 11/225,665, filed Sep. 12, 2004, now U.S. Pat. No. 7,916,952, which claims priority to provisional patent application 60/609,773, filed Sep. 14, 2004.

BACKGROUND OF THE INVENTION

This invention relates to compression of images, particularly sequences of digitized color video images.

The JPEG-2000 Bi-Orthogonal 9/7 Discrete Wavelet Transform

For two decades, band-split technologies such as sub-band coding, low-pass/high-pass split pairs, and wavelet sub-band codings, have been applied to image compression. Recently notable is the sub-band discrete wavelet transforms (DWT) used in JPEG-2000 (see, for example, "JPEG2000, Image Compression Fundamentals, Standards, and Practice" by David S. Taubman and Michael W. Marcellin, Kluwer Academic Publishers 2002). The JPEG-2000 still image and intra-coded (i.e., no motion compensation) moving image coding system supports two "bi-orthogonal" wavelet classes in a sub-band configuration. A DWT 5/3 bi-orthogonal sub-band configuration is used for lossless compression, when exact bit match is required, but with only a small amount (typically 2.2:1) of compression. A DWT 9/7 bi-orthogonal subband configuration is more generally useful, and can provide a transform coding method for higher compression ratios, while preserving the "visual essence" of the image (although not bit-exact).

The fundamental merit of the DWT 9/7 bi-orthogonal subband configuration is the resemblance to a low-pass/high-pass filter pair. The "bi-orthogonality" refers to odd and even sample locations using low and high pass filters, respectively. This structure is then split into 4 sub-bands in JPEG-2000, with low horizontal and vertical ("low-low"), high horizontal and low vertical ("high-low"), low horizontal and high vertical ("low-high"), and high vertical and horizontal ("high-high") subbands. This subband configuration can also utilize other band-split filter sets, and need not be structured bi-orthogonally at even/odd pixels. Any defined low band up-filter and high-band sum (with optional high-band filter) can yield a band-split suitable for use in compression coding.

FIG. 1 is a block diagram of a prior art 9/7 DWT bi-orthogonal subband compression system in accordance with the teachings of JPEG-2000. A higher resolution image 100 to be compressed (or a previous higher layer low-low subband image) is filtered down by a low band filter 112 (shown as having 9 taps) applied to odd pixels and a high band filter 114 (shown as having 7 taps) applied to even pixels, generating 4 subband images 120. These analytical filters 112, 114 are first applied in a horizontal pass, creating intermediate horizontal low and horizontal high subbands. These two intermediate subbands are then filtered in a vertical pass. Vertically filtering the horizontal low subband with the same analytical filters 112, 114 results in a low-low subband and a high-low subband. Vertically filtering the horizontal high subband with the same analytical filters 112, 114 results in a low-high subband and a high-high subband. During synthesis of an image from the 4 subbands, a low band filter 122 (shown as having 7 taps) is applied to odd pixels and a high band filter 124 (shown as having 9 taps) is applied to even pixels.

Band-split low-pass/high-pass filter pairs are most effective in separating spatial frequency energy. The bi-orthogonal DWT 9/7 is sufficiently similar to a low-pass/high-pass filter pair that it functions effectively. For idealized samples, the optimal low-pass filter is a truncated sine function (i.e., sinc $(x)=\sin(x)/x$) with the distance between the filter center and the first zero crossing being equal to the low-pass pixel spacing. For an octave (factor of two reduction in resolution) band-split, the spacing from filter center to the first zero crossing (in both directions) is 2.0 in source resolution units, and 1.0 in the half-octave result resolution units. The low-pass filter of the DWT 9/7 roughly resembles this octave truncated sinc, although its dimensions and weights differ somewhat. While idealized linear samples never occur in practice, they form the basis of image processing theory, such as Nyquist sampling and filtering. Note that theory uses a sinc of infinite extent, which can be truncated in actual practice. A truncated sinc is not ideal according to filter theory because it is truncated and typically non-linear, and because the samples are not ideally filtered when they are created or reconstructed. However, a truncated sinc is as close as possible to optimal in most image filtering applications.

Quantization

A part of most image compression coding is the use of quantization. A "quantization parameter", often known by its initials "QP", is divided into localized frequency coefficients in essentially every common type of non-lossless compression system. To reconstruct a compressed image, the frequency coefficients are re-multiplied by the appropriate quantization parameter. Because of the integer nature of the quantized values, the reconstructed coefficients with vary by ±half of the value of a step in the quantization parameter. For example, if the quantization parameter is 6, the reconstructed value will typically vary ±3. Further, in order to increase the number of zero coefficients, which code most efficiently, a "deadband" is usually applied around zero. Thus, for example, even with a quantization parameter of 6, the value of 0 in a coefficient may span the range of ±6 (rather than ±3 without any deadband).

In JPEG-2000, the quantization parameter may be specified for each subband with a single floating-point value. The JPEG-2000 deadband is fixed at double the width of the quantization step. JPEG-2000 also uses bit truncation methods to reduce coded bits which remove some small quantized values, even though the quantization was non-zero. Because of this, JPEG-2000 does not compress only with quantization, but also with the coded location of bits, often resulting in a relatively random additional error, above and beyond quantization error.

Coefficient Coding Structure

The coding of frequency coefficients is typically a lossless process involving some fixed structure and a variable-length coding (VLC) method (such as Huffman or arithmetic coding). It is typical for the coefficient coding structure to match the transform. For example, in MPEG-2, the structure of the coefficient coding is identical to the Discrete Cosine Transform (DCT) 8×8 pixel block. A pattern of variable length code is applied to the order of values in an 8×8 block, such as zig-zag from the corner, or a left-to-right, top-to-bottom scan. In JPEG-2000, the DWT 9/7 is coded up from the root coefficient or bottom resolution to each four-fold expansion of coefficients creating the sub-bands (low-low, high-low, low-high, and high-high). The coefficients are then synthesized into the next higher resolution, and become the low-low subband of the next layer up.

Variable Length Coding

Variable length codes used in image compression range from extremely simple, such as run-length codes and delta codes, to moderately complex such as arithmetic codes. The purpose of the variable length code is to reduce the number of bits necessary to code the coefficient values compared to using a fixed number of bits capable of coding the maximum range. For example, if 16 bits are used because the values can range between ±32767, but only a few values are larger than ±127, then 8-bits could be used with one "escape" code reserved to indicate that the next value needs an additional 16-bits. Although the large "escaped" value then needs 24 bits (8+16), it is usually infrequent enough that the average coefficient coding size will be nearer to 8-bits than 24-bits. This methodology can be extended based upon the principle that very small values, and even zero itself, are much more likely than larger values of any size. In this way, a Huffman table attempts to use the shortest codes for small and likely values, and gradually longer codes for larger and less likely values.

The arithmetic coding methodology allows multiple code values to be coded together, resulting in codes which have non-integer numbers of average bits for each coefficient code value. For example, two values may be coded with 7 bits, such that each code value uses the equivalent of 3½ bits each.

It is typical in compression systems such as MPEG-2 and JPEG-2000 to combine run-length, delta, and Huffman codes.

Motion Compensation

JPEG-2000 does not offer motion compensation, since every frame stands alone. This is known as "intra" coding. MPEG-2, and many other similar coding systems, offer motion compensation, using blocks and motion vectors, for "inter" coding of images in a sequence of images. In such motion compensated coding systems, it is common practice to structure the motion blocks as a superset of the transform coding blocks. For example, in MPEG-2, the motion blocks are typically 16×16 pixels in size (16×8 for interlace), which encompasses four 8×8 DCT blocks (two for interlace). Thus, the block motion compensation structure is closely fitted to the DCT transform coding structure. MPEG-4, both as part 2 (original MPEG-4 video) and part 10 (also called the "Advanced Video Coder"), are structured similarly to MPEG-2 in these aspects.

Spatial Scalability

MPEG-2 offers a rarely used "spatial scalable" option which allows an additional resolution increasing layer to be coded. The up-filter for this option differs greatly from the theoretically optimal truncated sinc. MPEG-2 also offers signal-to-noise-reduction (SNR) scalability, which is also rarely used. The basic structure of the SNR level of MPEG-2 is identical to basic MPEG-2 —summing a correction to improve signal to noise in the resulting image. Neither spatial scalability nor SNR scalability are targeted at any specific goals, only general increase in resolution and SNR, respectively. Only a single SNR and a single spatial scalability level are defined in MPEG-2.

JPEG-2000 offers the ability to prioritize and compartmentalize the order of bits in an image, such that early termination of decoding is possible (if the image is encoded with prioritization and/or compartmentalization). This allows a method of scalability for either SNR or resolution enhancement, but is limited by the bit-plane ordered coding and block-region compartmentalization properties of JPEG-2000. For example, transformed pixels of higher priority can be pre-shifted left during quantization (thus scaling by powers of two), and un-shifted during decoding, to provide a limited form of SNR scalability (limited since a left shift scaling must be a power of two). All highest significance (most significant bit) bit planes (within a tile partition or other regional compartment) are decoded first, then the next highest bit, etc., until the decoder truncates prior to decoding all of the available bits, or until all coded bits have been decoded. This method of ordered coding and optional pre-shifting allows some spatial and SNR scalability, but is limited to stopping within the boundaries a specific pre-ordered bit plane. Thus, the scalability available within JPEG-2000 is limited to bit-planes sharing a common QP, which are by their nature separated by a factor of two in significance. Finer granularity of scalability is not possible in JPEG-2000.

Floating Point

It has been common practice to mix floating-point and integer computations in reference compression coder software. For example, MPEG-2 and MPEG-4 use floating point reference DCT implementations, but integer processing for color processing, motion compensation, and most other aspects of the coding systems. JPEG-2000 uses a combination of integer and floating-point processing in its reference implementation. MPEG-4 part 10 uses an "integer transform" which combines the quantization and DCT transform steps into a single integer operation. Although the MPEG-4 part 10 implementation is not bit-exact invertible, the integer decoding is intended to exactly match between the encoder and decoder. This is a design feature of motion-compensated coding systems which the current inventor (along with David Ruhoff) has filed as patent application number 20020154693, entitled "High Precision Encoding and Decoding of Video Images". The use of "exact match" decoding (that is, exactly matching between the decoder portion of the encoder, and all bitstream decoders) allows limited precision integer computations to be used without propagating errors when using motion compensation.

Some integer processing has been an essential ingredient of most if not all previous compression coding systems. This has been intentional, since floating-point computation has usually been substantially slower than integer computation, especially 16-bit and 8-bit integer computation.

OpenExr

Relatively recently, Lucasfilm Industrial Light and Magic (a digital special-effects production company) and Nvidia (a maker of video cards for personal computers) have teamed up to create a standard known as "OpenExr". OpenExr is an open "Extended Range" floating point representation featuring a 16-bit floating point representation having a sign bit, a 5-bit exponent, and a 10-bit mantissa. This representation provides sufficient precision for most image processing applications, as well as allowing an extended range for white and black. The 16-bit "half" floating representation provided by OpenExr can be directly mapped to standard 32-bit IEEE floating point representation for easy interoperability.

It is common practice to display pixel values with black at zero, and white at the maximum integer value, or at a floating value of 1.0. However, digital image masters, especially those involving computer graphics, often need to represent a wider range of white and dark than is available with 8-bit or 10-bit integers having black at 0 and white at 255 or 1023, respectively. OpenExr allows white values and black values to extend substantially beyond this range. Further, concatenated computations will have higher resulting precision when using OpenExr16-bit floating point representation, or 32-bit floating point representation, than integer computations (even when using integer computations with exact-match decoding).

OpenExr has the further benefit of allowing direct representation of linear light values, rather than requiring a non-linear (usually a video-gamma exponent) representation when using integers for pixel values.

OpenExr also offers an optional lossless compression coder (usually yielding 2:1 compression). This compression coder is based upon a combination of the simple Haar difference wavelet, a reduced-precision clustering table, and a Huffman variable-length code. The reduced-precision clustering table increases compression if many of the code values are not used. For example, such is the case if converting from 10-bit integer pixel values, since only 1023 codes (of the possible 65536) codes would be used.

SUMMARY OF THE INVENTION

The invention encompasses systems, methods, and computer programs for high quality wide-range multi-layer image compression coding.

One aspect of the invention is the consistent ubiquitous use of 32-bit floating point for pixel and transformed pixel values in all computations, except for initial RGB (red-green-blue channels) image file input and at the quantization step itself. This aspect of the invention can be extended to 16-bit OpenExr floating point, to 24-bit floating point, to 48-bit, 64-bit, 128-bit, and all other useful floating point computational formats.

Another aspect of the invention applies an adjustable floating-point deadband, via subtraction and zero-floor during encoding, and via addition during decoding.

Another aspect of the invention is the preservation of the inherent wide range of floating point representation throughout compression. This includes values above 1.0, very small values, and negative values. One of the most significant practical benefits of this aspect of the invention is the ability to efficiently compress wide-range moving and still image data, beyond the brightness value implicit in the selected numeric representation of the final displayed reference white.

Another aspect of the invention is to use an optimal band-split filter phase construction in which low-pass bands are created in between pixels by appropriate selection of filter tap weights. The benefits of the more optimal band-split filter structure also apply to SNR improvement layers, at any resolution level.

Another aspect of the invention uses entire SNR layers at lower resolution levels. This aspect of the invention extends the notion of having the SNR resolution layer at the final resolution by allowing multiple SNR constructions. The use of the optional low-low band in a DWT 9/7 bi-orthogonal sub-band wavelet for the SNR layer is one such novel SNR structure. The use of optional switching between the more optimal band-split filter and the DWT 9/7 bi-orthogonal wavelet, based upon least bits with a common quantization, is another novel aspect of this invention. This aspect of the invention further extends these concepts to having multiple SNR layers at the full resolution level or at any lower resolution level.

Another aspect of the invention is the targeting of specific SNR layers to specific quality improvements. For example, one SNR layer can be applied to details in the image, using a high-pass or band-pass filter to select specific spatial frequencies for that SNR layer. Further, multiple pass-bands can be summed, such that a particular SNR layer can improve several bands simultaneously.

Another aspect of the invention is to concentrate coding bits in regions of interest in targeted band-split and SNR layers by decreasing the amplitude of pixel differences or high bands near the image frame edges using a weighting which decreases, possibly to zero, as a function of nearness to the frame edge. In the high-frequency bands, the decrease can result in decreased sharpness and detail. In SNR bands, the decrease can result in less accuracy, clarity, and even less noise, at the frame edges.

Another aspect of the invention is to establish a collection of statically-assigned targets for high-pass layers and/or for SNR layers. In this way, during decoding, whichever regions are of greatest interest can be decoded, while those of lower interest need not be decoded. Thus, numerous regional enhancement layers (both high-band and/or SNR) can be provided, allowing detailed decoder focusing on specific regional areas.

Another aspect of the invention improves the SNR by using a lower quantization value (better precision) for regions of the image showing a higher difference (compression coding error) from the original (for that resolution layer).

Another aspect of the invention is optional application of non-linear functions of R, G, and B, or of Y, U, and V, such as gamma or log, when computing the difference values when creating an SNR layer.

Another aspect of the invention is to improve layered transform quantization by utilizing finer overall quantization (by using lower quantization parameter values) at lower resolution levels, in conjunction with regional quantization scaling. Since the lower levels are at a lower resolution, each pixel in a lower level can affect a number of pixels in higher layers.

Another aspect of the invention to characterize and remove source image fixed-pattern noise, when such characterization is possible, prior to motion-compensated compression. Another aspect of the invention is the process whereby fixed pattern noise is reduced or removed before using other technologies to steady the scanned film image, prior to compression with this invention.

Another aspect of the invention is the use of one or more full-range low bands, meaning that at least the lowest band of a band-split hierarchy utilizes floating-point representation to provide wide-range and high precision.

Another aspect of the invention is the use of alternate quantization control images for SNR bands and other high resolution enhancing bands. As another optional aspect of this invention, however, if a coarser quantization is used at one or more required or optional layers (for higher compression at those layers), then it can sometimes be beneficial to dither the pixel values with pseudo-random noise prior to quantization.

Another aspect of the invention is to apply the lossless variable-length coding of band-split transform pixel coefficients using adaptive regions. These regions can have arbitrary size and shape, and are selected solely on lossless coding efficiency (i.e., minimum bit-size). Another aspect of the invention applies adaptive coding region size, shape, and variable-length coding tables to low resolution floating-point low bands or floating-point regional quantization images.

Another aspect of the invention is the use of a file structure for the layers of bits. Each resolution layer, each SNR layer, each floating-point lowest band, each quantization regional low band, and the motion compensation form different aspects of the bits generated during compression. The compressed bits are organized into files, with one file for each frame for each aspect of that frame. Each aspect is further placed in a folder dedicated to that aspect. The overall project or scene contains all of these aspect folders within a highest-level folder or storage device.

Another aspect of the invention is an optional method of inserting new intra frames by counting the number of bits needed for a motion compensated frame. If that number is not at least a reasonable percent less than the bits needed for the previous intra frame, then the motion-compensated frame can be discarded and an intra frame can be made.

Novel and useful aspects of the invention include at least the following:

(1) Use of a different quantization parameter value at two or more resolution levels of a coding transform resolution hierarchy, including use of reduced-resolution levels of a band-split or band-split hierarchy as regional scaling for quantization.

(a) Optionally applied to the bi-orthogonal subband 9/7 Discrete Wavelet Transform resolution hierarchy.

(b) Optionally applied to a more optimal band-split hierarchy.

(c) Optionally including a minimum and/or maximum on the reduced-resolution quantization scale, optionally as a function of each resolution level.

(2) Use of a floating-point quantization parameter value in conjunction with integer or floating point reduced-resolution levels of a band-split or band-split hierarchy as regional scaling for the floating-point quantization.

(3) Use of high precision, such as floating-point or half-floating-point, for a low resolution level of a coding transform hierarchy.

(a) Optionally including the bi-orthogonal subband 9/7 Discrete Wavelet Transform resolution hierarchy.

(4) Use of floating point everywhere in an image compression coding between input (pixel input is optionally integer), up to the point of the quantization divide (after which coding is bit-exact lossless). Thus, all transform processing is performed in floating point.

(5) Similar use in the decoder of floating point everywhere, after the dequantization multiply, up to the final pixel values (which may be optionally converted to integers as a final step).

(6) Use of actual image (intra-style) low bands for quantization, but applying quantization not only to intra-coding, but also (when motion compensated) to motion-compensated difference bands (including bands at different levels, higher and/or lower, of the band-split hierarchy).

(7) Use of a resolution hierarchy, wherein the minimum value is taken for a suitable low-low band, for use as a scale factor for the quantization parameter for all pixels at higher resolution levels;

(a) Optionally including use of specific minimum and/or maximum values, optionally as a function of each resolution level.

(b) Optionally including adjacent pixel overlap at each level, to take into account the influence of the band-split filter extent.

(8) Use of resulting coding error difference values to create a new suitable low-low band for use in weighting quantization for an SNR correction layer such that larger errors have smaller quantization parameter values (thus higher number of correction bits generated).

(a) Optionally including adjacent pixel overlap at each level, to take into account the influence of the band-split filter extent.

(b) Optionally including an additional quantization weighting as a function of the amount of factor that a given pixel's error is above the average error (9) Use of a different deadband quantization zone at two or more resolution levels of a coding transform resolution hierarchy.

(a) Optionally applied to the bi-orthogonal subband 9/7 Discrete Wavelet Transform resolution hierarchy.

(10) Use of noise dithering at the point of quantization, with the noise level being set at the quantization stepsize or smaller. When set smaller, the goal is for the sum of the inherent image noise (at that level) plus the added noise, to equal the quantization step. The deadband (around zero) noise dithering may optionally be treated differently than other steps.

(11) Use of a statistical numeric characterization, such as a transform amplitude histogram as a function of one or more of color, brightness, and region for one or more SNR layers in order to reproduce the appearance of film grain or camera noise.

(12) Use of the count of bits generated by a motion compensated frame, in relative comparison to the count of bits within the previous intra frame, to determine whether to recompute the motion compensated frame as an intra frame instead.

(13) Use of adaptive region sizes to optimize for minimum bits when lossless bit coding using one or more choices of variable-length coding tables.

(14) Use of an optional intermediate file folder structure to group compressed data components for various layers.

The details of one or more implementations of the invention are set forth in the accompanying drawings and the description below.

BRIEF DESCRIPTION OF THE DRAWINGS

FIG. 8 is a diagram showing one possible layered file structure in accordance with one aspect of the invention.

Like reference numbers and designations in the various drawings indicate like elements.

DETAILED DESCRIPTION OF THE INVENTION

Ubiquitous Floating Point

Figure 1:
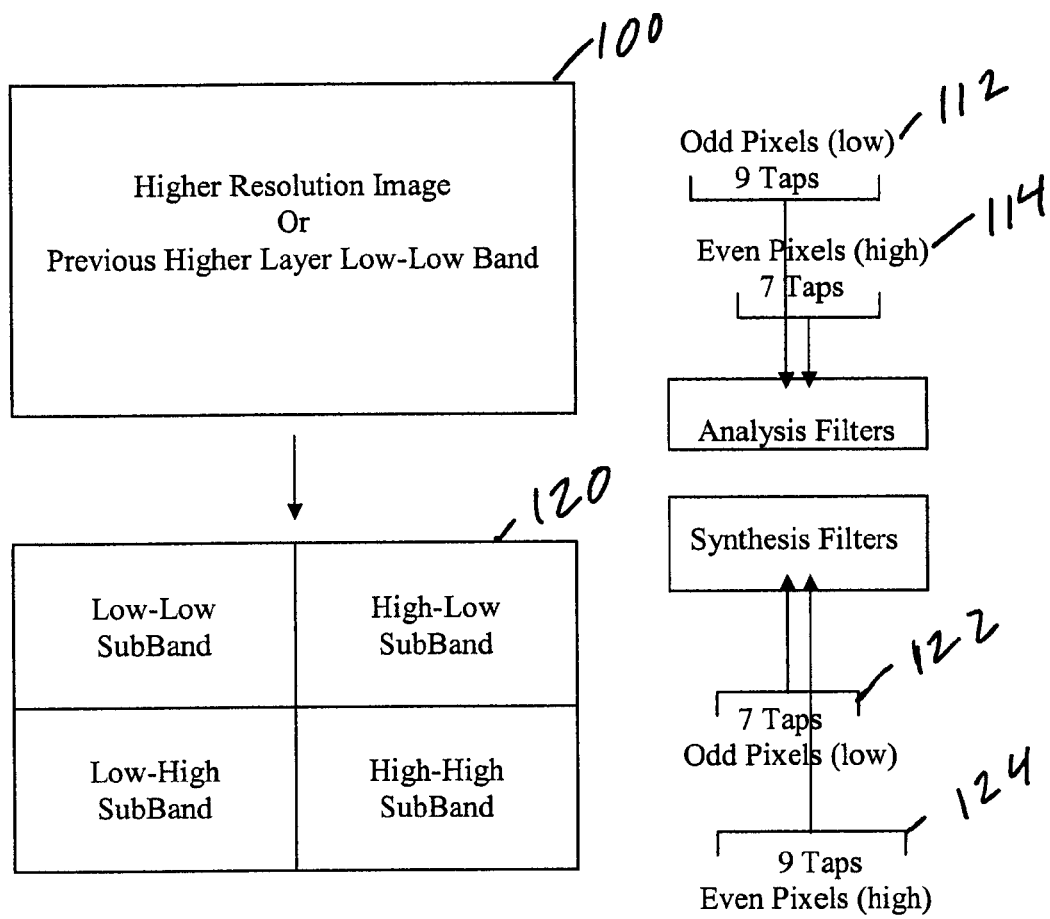
FIG. 1 is a block diagram of a prior art 9/7 DWT bi-orthogonal subband compression system.

As image compression processing becomes more complex, as it does with the many-layered DWT 9/7 subband transform, the number of concatenated computational steps increase substantially, and may be on the order of thousands of processing steps. The common practice of mixing integer and floating point processing becomes problematic because the quantization errors from a sequence of computation steps can accumulate to significant errors. One aspect of the present invention is the consistent ubiquitous use of 32-bit floating point for pixel and transformed pixel values in all computations, except for initial RGB (red-green-blue channels) image file input and at the quantization step itself. In the preferred embodiment, the image input options include 32-bit floating point (e.g., "Tiff", "DPX", or "OpenExr" file formats), 16-bit "half" floating-point OpenExr, 16-bit integer Tiff, and 10-bit DPX (for compatibility) file formats. In the preferred embodiment, output format options for decoded images include all of the above except 10-bit DPX. All of these formats, if they are not already 32-bit floating point, are immediately converted to RGB 32-bit floating-point values upon input. The ubiquitous use of 32-bit floating point allows more complex computations to be concatenated during encoding and decoding without accumulating significant error. The error can be made insignificant in comparison to the quantization error inherent in quantized compression (even for very finely quantized, high quality compression), and in comparison to the noise floor in the original image. This aspect of the invention can be extended to 16-bit OpenExr floating point, to 24-bit floating point, to 48-bit, 64-bit, 128-bit, and all other useful floating point computational formats. With the exception of 16-bit OpenExr "half" floating point, all other common floating point formats have more than 16-bits, and provide higher precision than is available with 8, 12, or 16-bit integer computations. Further, the increased precision of floating point eliminates the need for an "exact match" between the integer computations in the decoder subsystem within the encoder, and the integer computations of the final decoder, in order to eliminate pixel error drift and accumulation during motion-compensated decoding. This is because the increased precision minimizes drift in pixel values which can commonly occur in the least-significant-bit roundoff of non-exactly-matching computational orders. With ubiquitous 32-bit floating point processing within an image compression system, thousands of computational steps can be applied to pixels between intra frames without any significant error accumulating in the least significant bit of a 16-bit pixel.

All known high-compression-ratio coding systems, including the present invention, require an integer as the result of the quantization step which is applied after the transform. However, in the present invention, the transform value is 32-bit floating point (or other-sized floating point), and the dividing quantization parameter is 32-bit floating point (or other-sized floating point). Only the divided result is truncated to an integer. Each resulting integer is subsequently coded using a lossless variable-length coding system, and then reconstructed by multiplying the floating-point quantization value (which is typically conveyed in the coded bitstream or coded bit files). Note that it is common practice, including with the present invention, to allow different quantization values for different color channels, such as R, G, and B, or Y, U, and V.

Another aspect of the present invention applies an adjustable floating-point deadband, via subtraction and zero-floor during encoding, and via addition during decoding. For example, integer (max((Value−D), 0)/QP), where D=an adjustable floating point parameter, and the sign of the Value is conveyed separately in the output bitstream. Further, the deadband can be adjusted regionally, and/or as a function of which layer, to best optimize the compression coding. In this way, critical small integer values can be made most accurate using small or zero deadbands, and larger integer values, or less critical small integer values, can generate less coded bits via use of a larger deadband during quantization.

Extended Range

Typical compression systems such as JPEG-2000 and MPEG-2 utilize fixed-point pixel data, with the maximum pixel brightness corresponding to the maximum integer code value, or near that value. For example, white for luminance (or red, green, and blue) in 8-bit coding is usually either 255 or 235 (if it is 235, values between 236 and 255 are undefined). For 10-bit coding, white is usually 1023 or 940 (if it is 940, values between 941 and 1023 are undefined). Similarly, black for 8-bit coding is usually either 0 or 16 (with values below 16 undefined), and for 10-bit coding is usually either 0 or 64 (with values below 64 undefined).

With OpenExr 16-bit floating point, and with 32-bit and other floating point, there is no need to restrict pixel values to the logical range 0.0 to 1.0. OpenExr 16-bit floating point extends to 16384 times a reference white value at 1.0, and can represent very small values. Further, negative values can be represented.

With the coding system of the present invention, the inherent wide range of floating point representation is preserved throughout compression. This includes values above 1.0, very small values, and negative values. This can be very useful when compressing a wide-range source master image, since the final viewed white may be clipped to a value far below the bright values inherent in the original master. Digitally scanned film negatives, and wide-range cameras like the Thomson Viper in Filmstream Quasi-logarithmic mode, typically capture a much wider range of bright and dark values than are presented in the finished display image. The compression technology of the present invention allows efficient high quality coding of wide-range image data as well as fixed-range distribution coding.

In a purely logarithmic representation of image data, brightnesses can be scaled and color-balanced simply through addition and subtraction operations. In a linear floating-point representation, brightnesses and color balance are achieved by scaling multiplication. The compression technology described in the present invention can be applied to pre-balanced (i.e., unbalanced) image data, to rough-balanced data, or to final-balanced data. Compression is efficient and preserves the full image quality over the entire range independent of such balancing, and independent of whether the whites are clipped to a logical value of 1.0. Further, the use of floating point representation in the quantization parameter allows a wide dark range as well as a wide bright range. Further, negative pixel values can be directly coded (which can be useful in intermediate image subtractions or differences, or other created intermediate image elements).

Since the extended range representation of values is preserved throughout the compression process, the present invention can compress image information other than brightness, such as depth maps, infra-red images, texture height fields, radar reflectivity, and other such related useful information. The data range, noise floor, and other relevant information about such data can be taken into account to optimize the parameters of compression encoding. Even without such information, the present invention can directly code all of these forms of image-related non-brightness data.

However, one of the most significant practical benefits of this aspect of the invention is the ability to efficiently compress wide-range moving and still image data, beyond the brightness value implicit in the selected numeric representation of the final displayed reference white.

More Optimal Band-Split Transform Coding

Many aspects of the present invention can be applied to the DWT 9/7 bi-orthogonal subband wavelet transform. However, the present invention is not limited to that particular band-split method. In fact, the DWT 9/7 bi-orthogonal subband wavelet transform has a number of flaws when viewed as a band-split filtering method. These limitations can be summarized as follows:

(1) The low-pass and high-pass filters of the DWT 9/7 transform use filter kernels (FIR kernels) which vary somewhat from more optimal band-split filters, such as the windowed-sinc function described above. The net result of the variation from optimal is the introduction of aliasing. In compression, aliasing both reduces quality as well as increases the number of compressed bits required at that reduced quality.

(2) The DWT 9/7 bi-orthogonal transform is constructed by using a mutually orthogonal hi-pass and low-pass filter pair, centered at alternate pixels (even and odd, or odd and even). The kernels are reversed, such that the low pass filter kernel during the original transform becomes the high pass filter during the reconstruction, and vice versa. This structure allows a sub-band decomposition wherein there results a low-low (horizontal and vertical), low-high, high-low, and high-high band. The benefit of this approach is that the low-low band is further decomposed for lower layers. The drawbacks of this structure are as follows:

(a) The low-low band hierarchy is centered over a single pixel, with all high bands adding adjacent horizontal and vertical pixels. There is thus a positional shift, by a fraction of a pixel, at each layer.

(b) This structure does not optimally distribute the transformed energy, due to this pixel-centered low-low phase construction.

(c) The sub-band hierarchy is limited to factors of two in resolution decomposition.

(3) In typical application, such as in JPEG-2000, the DWT 9/7 is applied to non-linear pixel values. This is an additional deviation from optimal band-split filters based upon windowed-sinc filtering of linear pixel values. The result of this deviation is that sharp edges have additional aliasing, degrading quality and require additional bits at that degraded quality.

Down-Filtering

One aspect of the present invention is to use a filter phase construction in which low-pass bands are created in between pixels by appropriate selection of filter tap weights. This is in contrast to the DWT 9/7 filter structure which is exactly coincident with half of the pixels.

Figure 2:
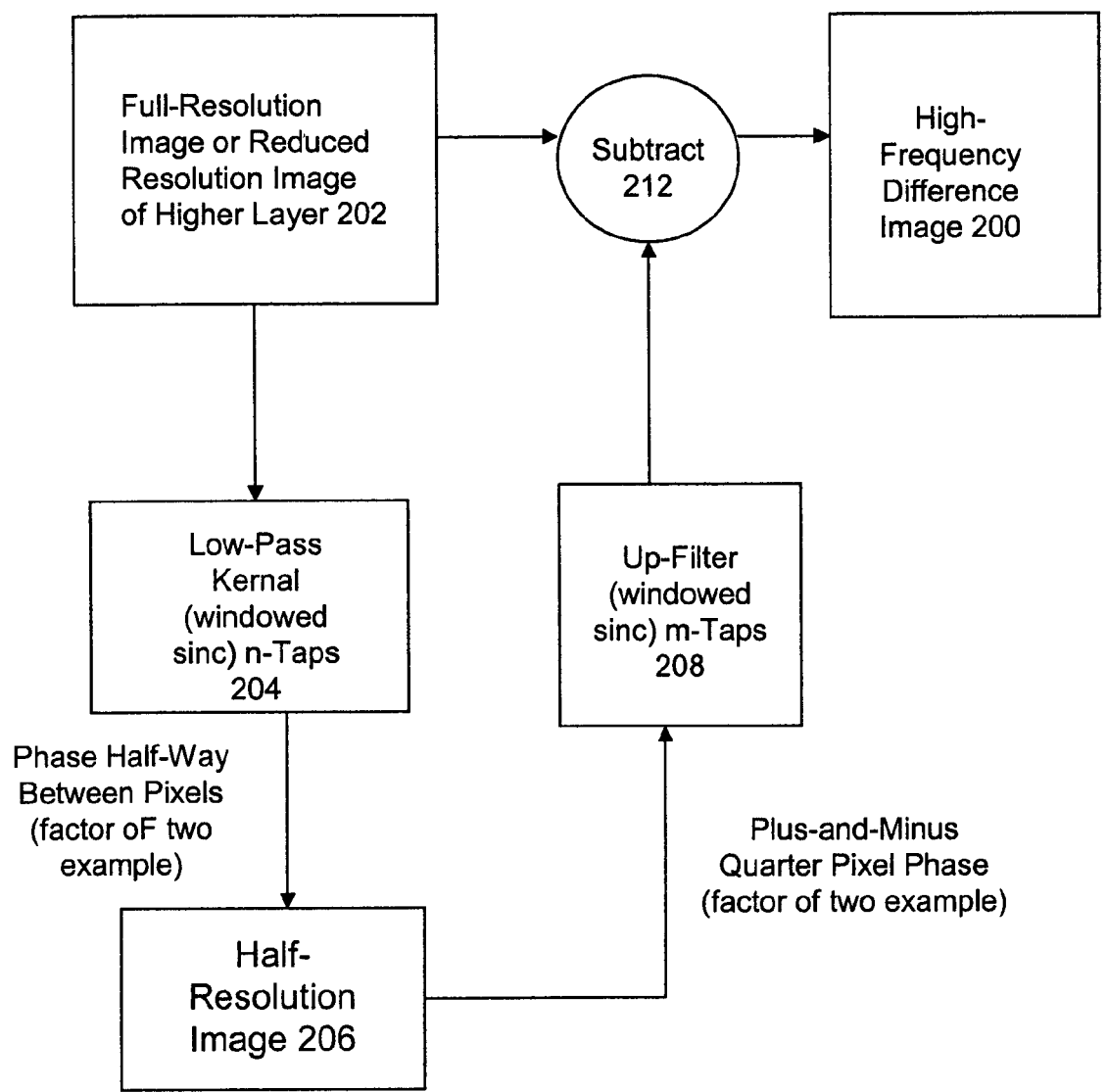
FIG. 2 is a block diagram showing application of an optimal two-dimensional spatial band-split filter in accordance with one aspect of the invention, using a factor of two in this example.

FIG. 2 is a block diagram showing application of an optimal two-dimensional spatial band-split filter in accordance with this aspect of the invention, using a factor of two in this example. In order to produce a high-frequency difference image 200, an input original image 202 (a full-resolution image in this example) is down-filtered using a low-pass kernel 204 to a half-resolution image 206. The low-pass kernel 204 implements a windowed sine function with n-taps and applied to a phase half-way between original image pixels in this example. The windowed sinc function has first zero crossings spaced at 2.0 pixel units (plus and minus one pixel) of the half-resolution image 206.

The half-resolution image 206 thus contains the low-band spatial frequencies of the original image 202. An up-filter 208 is applied to the half-resolution image 206 using a windowed sinc function with m-taps to generate a reconstructed image. The windowed sinc function has first zero crossings spaced at 2.0 pixel units (plus and minus one pixel) of the half-resolution image 206. The phase of the reconstructed image uses pixels that are only a quarter-pixel distant. The reconstructed image is then subtracted 212 from the original image 202 to produce the desired high-frequency difference image 200.

Note that the process shown in FIG. 2 also can be applied to a reduced resolution image of a higher layer.

Figure 3:
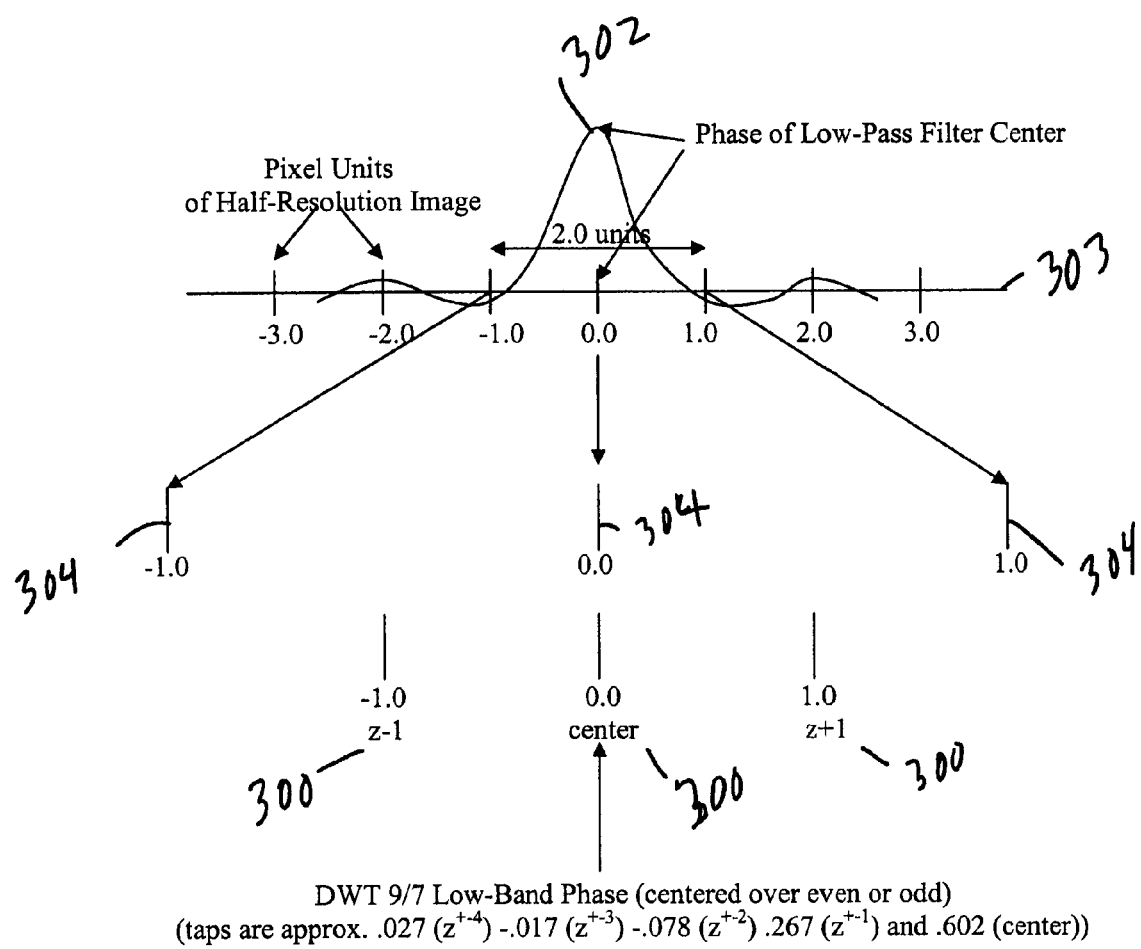
FIG. 3 is a diagram of a row of original pixels showing the coincident (with respect to the pixels) phase construction for the DWT 9/7 structure.

FIG. 3 is a diagram of a row of original pixels 300 showing the coincident (with respect to the pixels 300) phase construction for the DWT 9/7 structure. A low-pass filter function 302 is applied to the original pixels 300 such that the center phase (i.e., at 0.0 in the scale 303) of the low-pass filter function 302 is exactly centered on every other (even or odd) pixel. The result is the generation of a half-resolution pixel set 304 (note that the depiction of pixel sets 300 and 304 are magnified; the actual scale of such pixels 304 is shown at 303). However, by centering the phase of the low-pass filter function 302 over an original pixel, the generated pixels 304 primarily comprise energy from the centered original pixel. During the inverse transform, reconstructed pixels are a half-pixel distant during the up-filtering step.

Figure 4:
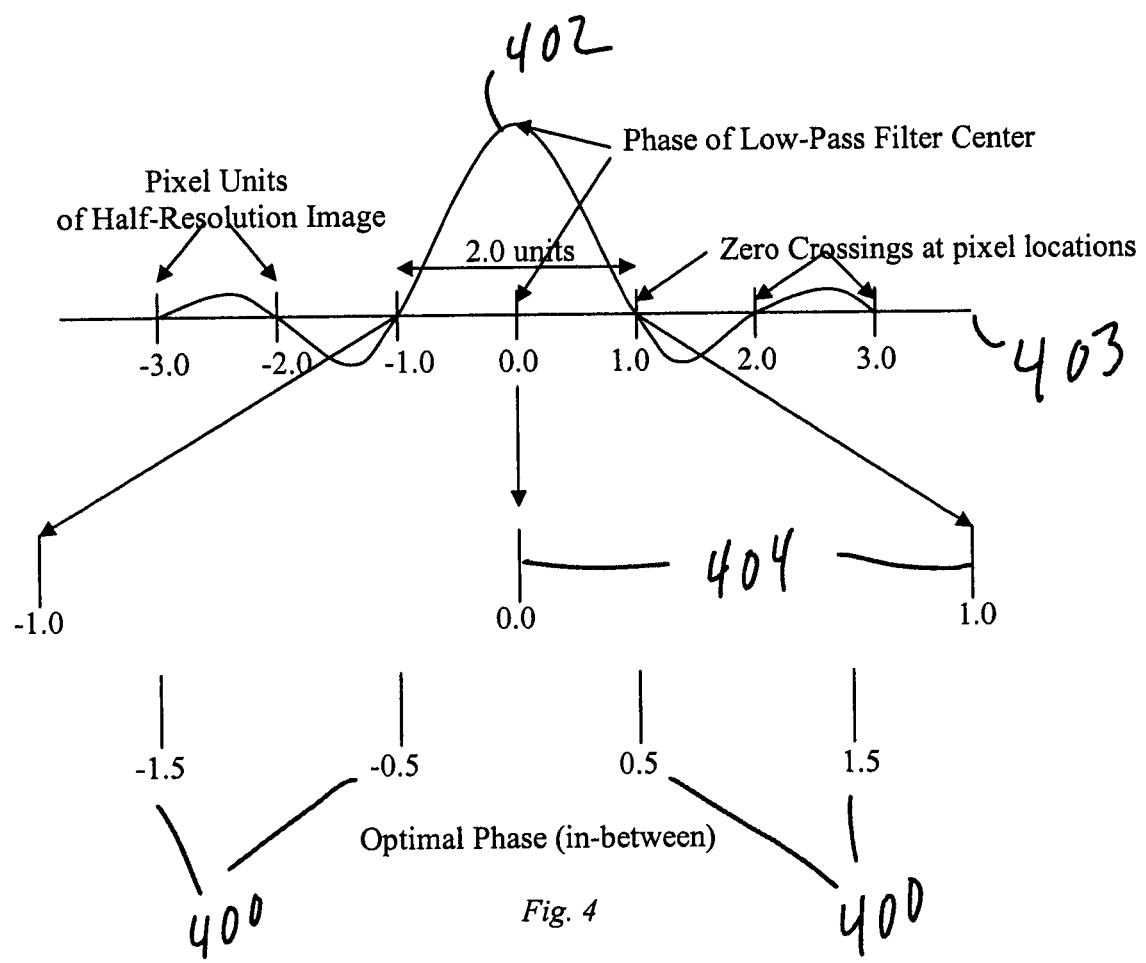
FIG. 4 is a diagram of a row of original pixels showing an intermediate (with respect to the pixels) phase construction for the present invention.

FIG. 4 is a diagram of a row of original pixels 400 showing an intermediate (with respect to the pixels 400) phase construction for the present invention. A low-pass filter function 402 is applied to the original pixels 400 such that the center phase (i.e., at 0.0 in the scale 403) of the low-pass filter function 402 is positioned in between the original pixels 400. The result is the generation of a half-resolution pixel set 404 (note that the depiction of pixel sets 400 and 404 are magnified; the actual scale of such pixels 404 is shown at 403). The use of an intermediate phase low-pass filter construction in the present invention is more optimal than the DWT 9/7 structure. This is because reconstructed pixels, during the inverse transform, are only a quarter-pixel distant during the up-filtering step. Thus, when applying the present invention, less energy is used for the quarter-pixel distant transform phase versus the DWT 9/7 bi-orthogonal sub-band phase.

The more optimal band-split filter phase structure, shown in FIG. 4 using a factor of two in resolution, as with the DWT 9/7. However, the general concept of this aspect of the present invention is that of centering the phase of down-filtered pixels between source pixels, as opposed to placing some or all of the down-filtered pixels in the same position as source pixels (as with DWT 9/7 bi-orthogonal subband wavelets). Since an optimal band-split filter phase structure supports arbitrary resolution relationship fractions, the phase may be inherently varying, as implied by the specific fraction. Thus, a ⅔ resolution down-filter has two down-filtered pixel phases for each three full-resolution pixels, whereas a ⅓ resolution down-filter naturally centers the down-filtered pixels over the center of the second of every third full-resolution pixel. The phase difference is such that successive down filterings in the style of the DWT 9/7 subband wavelet transform will be centered over the first (or second) pixel, thus resulting in a net displacement by a half of a pixel with each down-filter step. In contrast, the optimal band-split filter phase aspect of the present invention does not result in any fractional pixel displacement with each down filter step. Another way to view this is that a down-filter by a fraction of ¾ centers new 3 pixels (numerator) over the span of the original 4 pixels (denominator).

Arbitrary ratio relationships can be easily implemented by using a poly-phase truncated sinc filter, typically with several dozen phases, where the sinc width between zero crossings is set to two pixels wide at the lower of the input and output resolution. For up-filtering, the lower resolution is the input resolution. For down-filtering, the lower resolution is the output resolution. Both filters are applied in a typical application (going from a given level, or the original level, to a lower resolution level), since the image resolution is first down-filtered, quantized, and then up-filtered to subtract from the original (or higher level) resolution to create the difference values to quantize for the next level up.

The disadvantage of the more optimal band-split filter phase of the present invention when down-filtering is that an up-filter step adds a delta for every pixel in the final up-filtered image. Thus, five source pixels (original down-filtered, plus four deltas) are required for four resulting up-filtered pixels. The DWT 9/7 subband wavelet, however, need only add the high bands, resulting in four source pixels (low-low, hi-low, low-hi, and hi-hi) for every resulting four up-filtered pixels. Thus, there is 5/4 more data (in the factor-of-two resolution case) in the more optimal band-split filter phase structure, versus the DWT 9/7 subband wavelet structure. However, the amount of data at the up-filter step is not the primary concern in digital image compression. The primary concern is the amount of data after quantization and variable-length-coding. Given that the more optimal band-split filter phase structure of the present invention have smaller deltas, by perhaps as much as a factor of two, the more optimal band-split filter phase structure often outperforms the DWT 9/7 for image compression efficiency (i.e., ratio of output bits to input bits).

Note that which structure ultimately is better is scene dependent. It may depend on the type of image, the amount of noise (or grain) in the image, and frame-to-frame motion (if there is motion compensation). Further, the specific resolution level also affects which is better, since mid levels of image resolution can best benefit from the DWT 9/7 structure, and the aliasing damage from suboptimal filters in the DWT 9/7 is least problematic in these mid levels. Lower levels and higher levels, however, both usually are more optimal with the more optimal band-split filter phase structure of the present invention.

Given that the implementation of both the DWT 9/7 subband wavelet and the more optimal band-split down-filter and up-filter structure is relatively straightforward, both are easily implemented. In this way both filter structures can be tested and coded at each level, on each frame, to determine which is more efficient (i.e., outputs the least bits). If both transforms use the same quantization method, the quality should be relatively equivalent, so the determination can be made solely on the number of bits generated. Further, this determination can be applied regionally within an image, although boundary conditions make this somewhat complex. Even being applied on a per-level basis, the ability to dynamically determine whether to use the DWT 9/7 or the more optimal band-split filter (based upon truncated sinc) structure can result in substantial coding efficiency gain.

SNR Improvement

The benefits of the more optimal band-split filter structure also apply to SNR improvement layers, at any resolution level. The highest resolution levels are likely to favor the more optimal band-split filter, since the reduced size of the deltas from the more optimal band-split filter will usually be more beneficial than the DWT 9/7 subband structure. However, the selection of whether to use the DWT 9/7 subband wavelet transform of the more optimal band-split filter transform at each SNR layer can be dynamically determined by the number of bits generated (if using the same quantization for each during the comparison).

The DWT 9/7 subband structure allows optional SNR improvement on the low-low-band if that band is present. The optional low-low-band can improve the SNR prior to adding the high-low, low-high, and high-high bands. During decoding, the decoding of the low-low SNR improvement band can be optional, as determined at the time of decoding. It is also optional as to whether a low-low SNR improvement band is created during DWT 9/7 subband wavelet SNR processing. The equivalent structure using the more optimal band-split filter structure of the present invention is to apply an optional SNR band at the lower resolution prior to up-filtering. Such SNR bands (using the more optimal filter) are created at the same resolution as the image that they are improving. Thus, both the DWT 9/7 subband wavelet and the more optimal band-split filter support low-low resolution level SNR. However, with the more optimal band-split filter, the low-low resolution SNR should preferably be applied prior to up-filtering, with additional SNR layers applied at the up-filtered resolution, whereas the DWT 9/7 subband can be optionally applied at the time of up-filtering. However any further SNR layers at the higher resolution should include the DWT 9/7 low-low subband, if it is created during up-filtering.

Note that SNR improvement layers can be applied at any resolution level. Further, when using the more optimal band-split filter structure, the resolution steps need not be limited to a two-to-one ratio (whereas the DWT 9/7 subband wavelet is strictly limited to a two-to-one ratio, or an SNR layer at a one-to-one resolution ratio).

Figure 5:
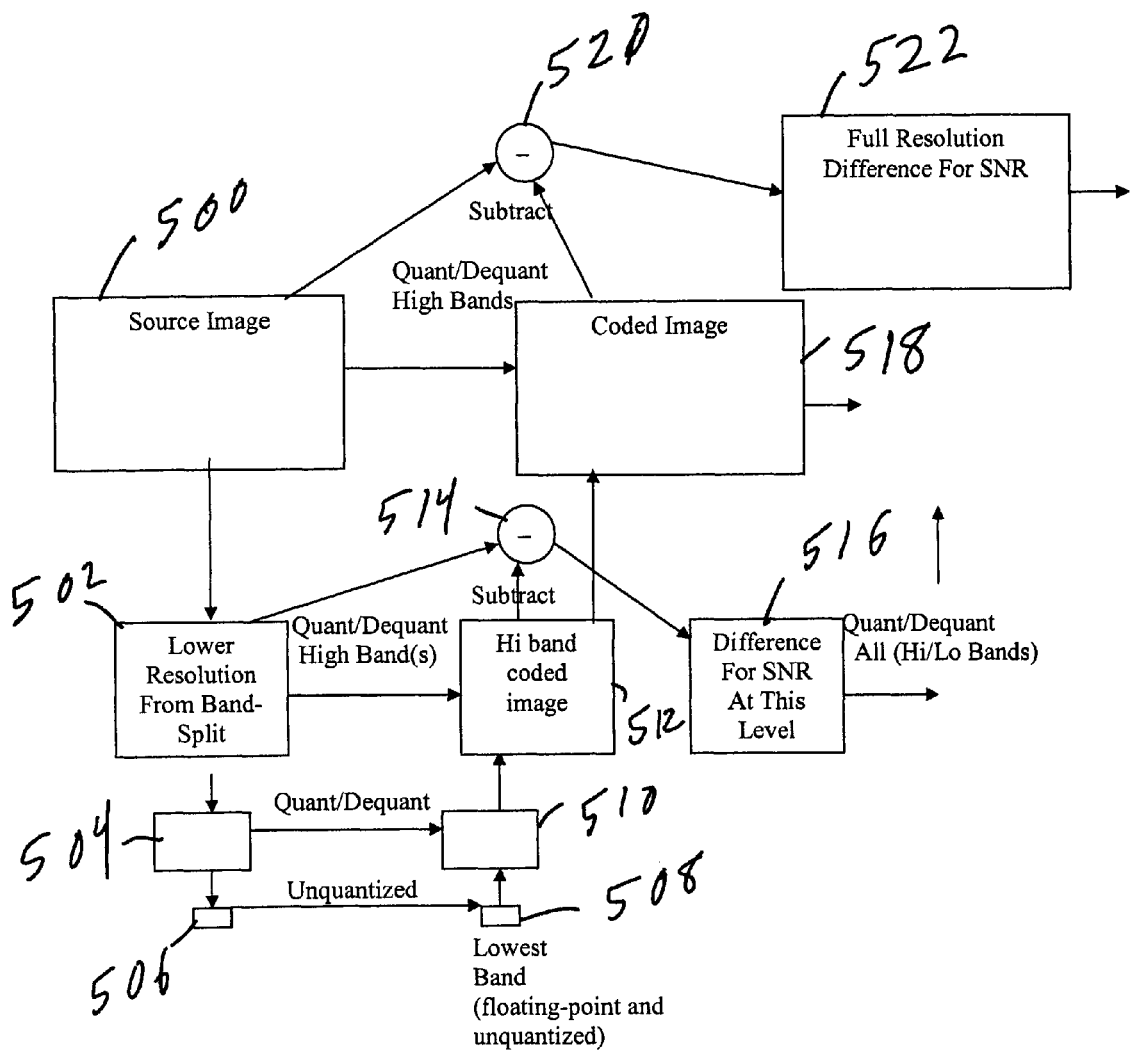
FIG. 5 is a block diagram showing one implementation of an image compression system having a resolution and SNR layered structure, with optional SNR layers at various resolutions.

FIG. 5 is a block diagram showing one implementation of an image compression system having a resolution and SNR layered structure, with optional SNR layers at various resolutions. A source image 500 is band-split in accordance with the teachings of this invention into one or more lower resolution images 502, 504, 506 (other number of lower resolution images may be used). The lowest resolution image 506 is left unquantized and represented in floating point format 508.

Moving up the chain of bands, the next lowest band-split image 504 is quantized and then dequantized, and then combined with an up-filtered version of the unquantized lower resolution image 506 to create a decoded image 510. Continuing up the chain of bands, the next lowest band-split image 502 is quantized and then dequantized, and then combined with an up-filtered version of the decoded image 510 from the next lowest level to create a high-band coded image 512. This high-band coded image 512 may be subtracted 514 from the corresponding band-split image 502 to generate an SNR difference image 516, which may be output to a decoder and optionally used within the encoder for further image processing.

The high-band coded image 512 may also be up-filtered and combined with a quantized/dequantized version of the source image 500 to create a full resolution coded image 518. The full resolution coded image 518 may then be subtracted 520 from the corresponding source image 500 to generate a full-resolution SNR difference image 522, which may be quantized, dequantized, and then output to a decoder.

Figure 6:
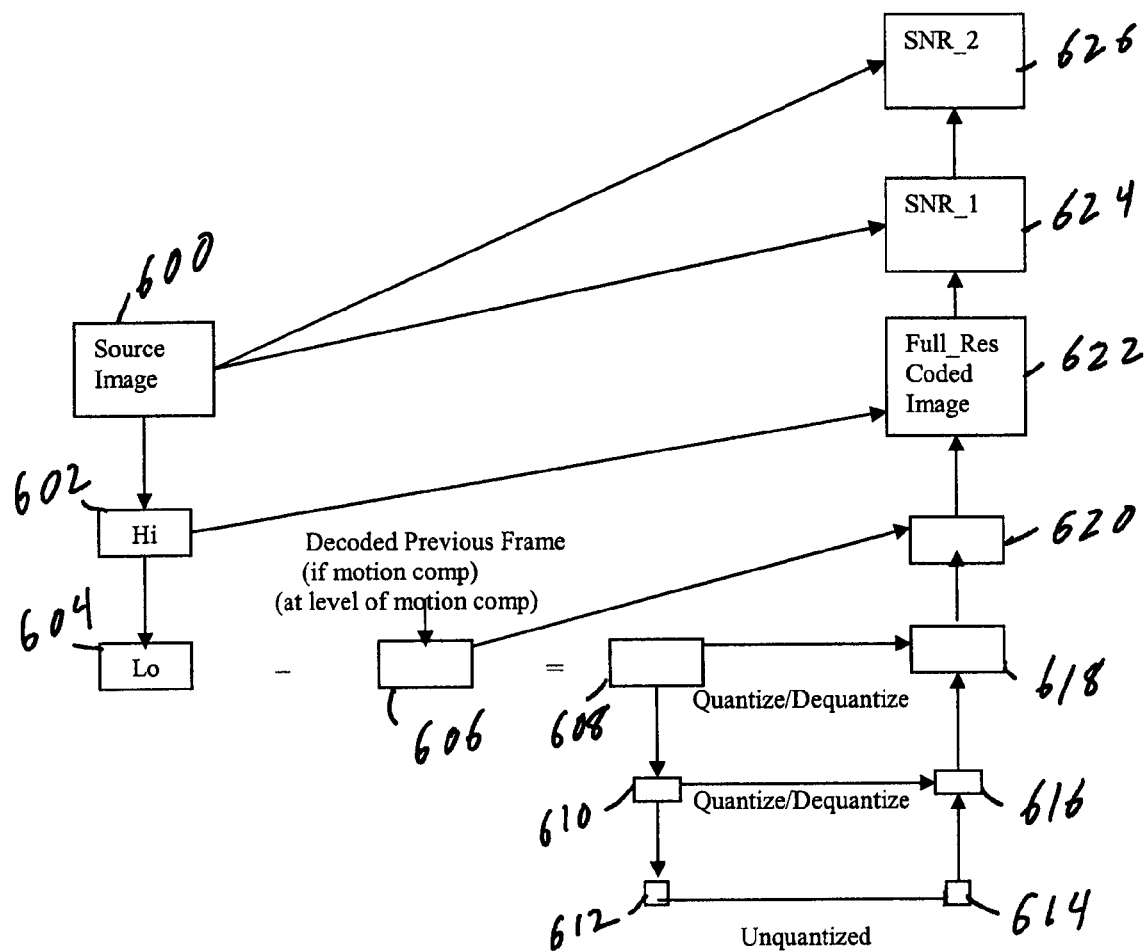
FIG. 6 is a block diagram showing one example of an image compression system having layered compression processing.

FIG. 6 is a block diagram showing one example of an image compression system having layered compression processing. A source image 600 is band-split into at least high band 602 and low band 604 lower resolution images. In this example, if motion compensation is used, a decoded previous low resolution frame 606 is subtracted from the low band image 604 to generate an intermediate frame 608. As in FIG. 5, the intermediate frame 608 can be band-split into one or more lower resolution images 610, 612, which are combined into increasingly higher resolution coded images 616, 618 (image 614 being an unquantized, floating point version of image 612). The highest level coded image 618 is then added to the decoded previous low resolution frame 606 to generate a real (viewable) image 620.

This image 620 can be combined with a quantized/dequantized version of the high band image 602 to generate a full resolution coded image 622. Targeted aspects of the full resolution coded image 622 can be compared with source image 600 to generate a full resolution first SNR image 624. If desired, further aspects of the difference between the source image 600 and the first SNR image 624 can be targeted to generate a full resolution second SNR image 626. Similar SNR processing can continue if desired.

Up Filtering

The DWT 9/7 subband wavelet uses a low synthesis filter kernel of 7-taps. Thus, for each low band transformed pixel, 7 pixels in the next higher band are affected during synthesis to the next higher resolution level. The high bands use a synthesis filter kernel of 9 taps, such that for each high band transformed pixel, 9 pixels are affected during synthesis.

The more optimal band-split filter is similar at low resolution bands, in that the windowed sinc kernel to up-filter the low-band has a similar "extent" (i.e., the degree to which a low band transformed pixel affects one or more pixels in the next higher band). However, the high band difference image is not filtered, but is rather added directly to the up-filtered low-band. Thus, the high band difference pixels, at a given level, do not contain any extent beyond their single pixel. However, at the next resolution band up, the pixels become the next low band, and the windowed sinc kernel extends their influence according to its size. The final high resolution level, or any lower resolution level which is displayed or saved, has the high band pixels with a single-pixel extent. Thus, the high-band difference pixels in the more optimal band-split filter are single-pixel differences, with each adjusting a single pixel, and not influencing adjacent pixels at its level. Because of this, there is not strict equivalence between the high bands of the more optimal band-split filter transform and high bands of the DWT 9/7 bi-orthogonal subband coding. Even if the same quantization value is used for the high bands of the more optimal band-split filter structure and the DWT 9/7 transform, the appearance is different because of the 9-pixel high-band filter extent of the DWT 9/7 transform versus the single-pixel high-band extent of the more optimal band-split filter structure. Because of this, the choice of whether to use the DWT 9/7 transform, or the more optimal band-split filters, should take into consideration the difference in appearance of these transforms. Even if both types of transform are quantized the same, the appearance is different. Thus, the transform with the lowest number of bits at a given quantization is not strictly the only criterion for selecting between the transforms.

Note that high-band pixels from the more optimal filter are appropriate for resolution-increasing layers, as well as for SNR layers at any level, including SNR layers at the highest resolution level.

Pixel Extent & Image Degradation

The property of pixel transform coefficient influence or "extent" is shared among DCT and other transform codes. For example, each of the 8×8 DCT coefficients influences an 8-wide by 8-tall pixel region when inverted. Similarly, a single pixel value in the original 8×8 pixel block affects all of the 8×8 coefficients in the transformed coefficients of the DCT. The main difference between the DCT and the filters described here, both more optimal band-split and the DWT 9/7 bi-orthogonal subband, is that the region of influence of the latter is approximately centered (plus and minus one pixel) about the current coefficient, whereas the DCT coefficients are associated only with a fixed-position block. Thus, a pixel at the edge of an 8×8 DCT block does not affect the adjacent block. A quantized DCT can thus exhibit block-edge artifacts, whereas the more optimal transform coding and DWT 9/7 bi-orthogonal subband do not degrade in this way. Instead, the degradation of quantized DWT 9/7 low and high bands appears as an unnatural "footprint" of the low (7-tap) and high (9-tap) synthesis kernels, as concatenated over all levels. In contrast, while the more optimal band-split filter may have an unnatural appearance due to the low-band up-filter kernel, concatenated over all levels, it only has local pixel inaccuracies, limited to single pixels, at the highest viewed level. Note that the more optimal band-split filter's low-band up-filter windowed sinc filter is often relatively invisible, since it preserves the soft low-band image appearance, without adding undue kernel ringing (if truncated at a relative small size, such as ±3 pixels or less). Thus, the more optimal band-split filter exhibits softness due to quantization, as well as overall pixel errors due to quantization, but does not exhibit as much ringing or other kernel footprint appearance artifacts as the DWT 9/7 transform.

This feature of the more optimal band-split filter allows a more graceful degradation when bits are reduced (by coarser quantization) in higher spatial bands. The image becomes softer, but does not exhibit aliasing. In contrast, the DWT 9/7 bi-orthogonal subband wavelet exhibits aliasing (as well as softening) if the high band bits are reduced (by coarser quantization). In general, softening alone is preferable to both softening and aliasing. Note that this quantization-caused aliasing is different from the DWT 9/7 aliasing inherent in lower bands, which requires more bits to code, but which is removed as higher bands are resynthesized.

Alternative Embodiments

It should also be noted that a less optimal phase structure centered over a pixel can be used with filters more similar to a truncated (also called "windowed") sinc than the DWT 9/7 subband wavelet filter kernel. The DWT 9/7 wavelet kernel is bi-orthogonal, which restricts the filter kernels to specific bi-orthogonal wavelet pair sets. When using a more optimal band-split filter which is more similar to a truncated sinc, the sub-band structure with low-low, high-low, low-high, and high-high cannot be used. However, the less optimal filter phase with a more optimal filter kernel, providing a better band split than the DWT 9/7 bi-orthogonal subband kernel, also offers benefits in some applications. However, the more optimal band-split filter phase structure is usually preferable.

Note that the use of a ⅔ resolution hierarchy forms a better match with the HDTV and SDTV formats in the United States of America, since ⅔ of 1920×1080 is 1280×720, and ⅔ of 720 is 480 (Standard definition). The more optimal band-split filter can also directly handle the odd relationships between 1280 to 640, 704, or 720, which are the typical horizontal values associated with 480 vertical Standard Definition. Further, the relationship of 1920 to 640, 704, and 720 can also be directly handled.

Digital Cinema is exploring horizontal values of 4096, 3840, 3656, 3072, 2560, and 2048, in addition to the 1920 used by HDTV. Similar sets of values are being explored for vertical resolution, corresponding to the 1.85:1 and 2.37:1 aspect ratios typical for movies. The flexibility of the more optimal band-split filters structure of the present invention provides direct support for all of these odd horizontal size relationships.

Targeted SNR Layers

A common practice is to have a single SNR layer in compression systems, at the final resolution. However, in another aspect, the present invention uniquely uses entire SNR layers at lower resolution levels. Further, this aspect of the invention extends the notion of having the SNR resolution layer at the final resolution by allowing multiple SNR constructions. The use of the optional low-low band in a DWT 9/7 bi-orthogonal sub-band wavelet for the SNR layer is one such novel SNR structure. The use of optional switching between the more optimal band-split filter and the DWT 9/7 bi-orthogonal wavelet, based upon least bits with a common quantization, is another novel aspect of this invention.

This aspect of the invention further extends these concepts to having multiple SNR layers at the full resolution level or at any lower resolution level.

In addition, another unique aspect of this invention is the targeting of specific SNR layers to specific quality improvements. For example, one SNR layer can be applied to details in the image, using a high-pass or band-pass filter to select specific spatial frequencies for that SNR layer. For instance, a band-pass filter between ⅓ of full resolution and ¾ of full resolution can be used to weight pixel differences which improve this selected resolution band. Further, multiple pass-bands can be summed, such that a particular SNR layer can improve several bands simultaneously. In contrast, the common practice of SNR improvement does not target specific frequencies (i.e., it is an all pass filter).

For another example, one SNR layer can be targeted to improving the quality of mid-gray portions of the image. Thus, a filter would be applied to the SNR layer, proportionally selecting pixels which are mid-gray, based upon how close they are to mid gray (both in color and brightness). The resulting pixel differences (as weighted by their proportion of being mid-gray) can then be coded as a normal SNR layer at that resolution level (including full resolution). Further, specific colors and/or brightnesses can be selected instead of mid-gray. For example, dark regions and bright red regions could be selected using standard color selection or lookup methods, thereby forming a proportion used to weight SNR pixel differences for an SNR layer at any resolution level. A simple way to target dark regions of the image is to build a proportion based upon the inverse of the sum of the pixel values as decoded at any level. Such an inverse is largest when the sum of the pixel color components is low (e.g., where red+green+blue is small or luminance is small). This proportion thus forms a weight which emphasizes dark pixel differences in an SNR layer designed to improve dark detail. Similarly, a color extraction where red minus green plus red minus blue is used naturally emphasizes reddish-color pixels. Another useful targeting method would be to use YUV or other color spaces for some layers, and RGB for other layers. It may also be useful to use just luminance (Y). Many other natural color and brightness selection techniques can be used in order to target SNR layers. In contrast, the common practice of SNR improvement does not target brightnesses or colors (i.e., it passes all colors and brightnesses).

Thus, targeting of specific features can be specified for each SNR layer. In general, the decoder need not know those specific features used in SNR layers, such as band-pass and color-selection weights, when such weights merely scale the difference values during encoding to select the targeted pixels of interest. Those difference values are decoded without further scaling, and are thus inherently applied to the target improvement. However, some forms of weighting, such as a weighting of pixel differences based upon a dark weighting, may be most effective if the identical weighting formula is applied during decoding of that SNR layer, based upon decoded pixel values (the same decoded values used during encoding). Thus, it may be necessary for some forms of targeted SNR to signal to the decoder which SNR-type is being applied at each SNR layer, so that the decoder can reproduce the appropriate weightings. In general, SNR-specific decoding features affect non-uniform weightings of quantization, either via weighting the difference signal in such a way as to require an inverse-weighting during dequantization, or alternatively via weighting the difference amplitudes, which is unweighted during decoding.

Note that some target weighting methods involve per-pixel targeting, such as the inverse of the sum of decoded red, green, and blue to target dark pixels. Such weighting methods require a similar process in the decoder for each pixel. Other weighting methods, such as weightings to the SNR difference values, may be applied in the encoder with a different weighting at every pixel, but need have no inverse weighting process applied during decoding, since the encoded weights are intended to be left "baked in" during decoding as if they were inherent to the original image signal. Still other methods, such as wide-range scaling of pixel differences, or use of regional adjustments to the quantization value, require regional processing in the decoder to properly re-adjust the scale of the differences, or to regionally adjust the quantization value for decoding so that it matches the quantization value used during encoding. Which method or methods are used can be signaled to the decoder, and each method is useful for all portions of the transform-coded values, including SNR, the motion compensated difference image at any layer, and resolution enhancing-layer encoding of intra images or motion-compensated difference images. It is also useful to mix-and-match all of these targeting methods in each frame, to optimize the application of these methods. However, the main intent of these methods is to apply one or more method to each SNR layer to target specific image features for SNR improvement.

For those SNR layers not requiring special decoding methods, the targeted pixel differences preferably are added with each layer, using the normal dequantization and filter reconstruction (which is synthesis in the case of DWT 9/7). Since such differences are known to the encoder, the encoder's decoder applies these differences, and is then ready to take new differences from the original (at that resolution layer, possibly full resolution). The new differences can then be weighted with more of the same target, or with different target features, or combinations of these, and so-on, for as many targeted SNR layers as are created during encoding. Thus, targeting of one or more features within each SNR layer is easy to apply iteratively for multiple SNR layers, without any relationship being required between the types of targeting.

Of course, the decoder should know (by signaling or implicitly) which SNR layers to apply in which order, since further SNR layers apply additional SNR improvements to the concatenation of previous layers. However, it may sometimes be beneficial to decode some specifically-targeted SNR layers without decoding previous layers, since the previous layers may not have targeted features which may be most needed during that specific decoding. However, selective decoding of SNR layers will usually be applied by selecting in-order, such that each SNR layer improves the concatenation of all previous, and eliminated SNR layers would all be logically subsequent to the stopping point (the last SNR layer applied).

Note that full-resolution SNR layers generally will be considered optional to the decoder, since each full-resolution SNR layer's function is to provide improved picture fidelity with respect to the original image.

Further, SNR layers at lower resolution levels is also optional for that level, although they usually, but optionally, are required prior to applying high resolution layers and levels.

Spatial Targeting

Efficiency can be gained in some applications by concentrating coding bits in regions of interest. Another way to view this is that bits used to create details and nuances in regions of little interest are being wasted. For example, many television receivers use "overscan" which places the edge of an image outside of the viewable display area, making those outside portions invisible. Overscan in the range of 4% to 8% is typical. However, some receivers, and computer displays showing decompressed images, do not overscan. It is thus useful to create the full image, but to concentrate coding bits on regions away from the frame edges.

This is easily accomplished in targeted band-split and SNR layers by decreasing the amplitude of pixel differences or high bands near the edges using a weighting which decreases, possibly to zero, as a function of nearness to the frame edge. In the high-frequency bands, the decrease results in decreased sharpness and detail. In SNR bands, the decrease will result in less accuracy, clarity, and even less noise, at the frame edges.

It is also possible to discover which regions of the image are in-focus versus which regions are out-of-focus. This can be accomplished using any useful form of variance measure at any band at or above the motion-compensated layer (or at any useful mid-detail layer for intra-coding). For example, at a suitable mid-detail spatial frequency, such as ¼ of the full resolution, the variance from average of luminance, or any useful function of red, green, and blue (such as red plus green plus blue plus hue plus saturation) of the decoded image at that layer can be used to determine local regional detail. Such information can then be used to weight higher resolution high-pass layers, as well as SNR layers at that or higher resolution layers. If the variance from average is small, low-amplitude details may still be present, suggesting that the amount of weighting should not modulate all the way to zero, but rather to some useful fraction of full weight.

Note that such weightings need not be conveyed to the decoder, since the intent is to reduce the amplitude in certain regions (such as near the edge), and that reduced amplitude is already present after the weighting. Thus, the reduced amplitude during encoding is automatically reproduced during decoding.

If regional quantization values are conveyed to the decoder, some types of weightings can be applied to the quantization, or equivalently to a regional scaling of the pixel differences (which would also need to be conveyed to the decoder). The quantization deadband can also be widened, in addition to coarser quantization, in regions of lower interest, although the regional deadband adjustments are also conveyed to the decoder.

Thus, there is a natural choice for regions of lower interest between coarser quantization versus reduced amplitude, versus a combination of both coarser quantization and reduced amplitude. Information is conveyed to the decoder when using regional quantization adjustments, and/or regional deadband, and/or regional amplitude scaling and re-scaling. No additional information need by conveyed by regional weightings which use the quantization and deadband which would have been present if no weighting was applied, and thus where such weightings are intended to be reproduced during decoding as if they were inherent to, or "baked in", to the original image signal.

Levels of resolution in a band-split resolution hierarchy are separated into a low-band and one or more high bands. The low bands are the actual image, at or above the motion compensation layer. The high bands contain detail to be added to the image to increase resolution, or to improve SNR. Thus, variances in the low bands represent picture detail at mid and lower frequencies. The high bands are themselves variances, to be applied about the low-band pixel values as their local averages. Thus, low-bands and high-bands are used differently when determining regional image detail at various resolution levels.

In addition to edge-nearness and mid-band variance, other useful methods can target regions for lower weightings and/or coarser quantization. For example, a person can circle regions of high interest, or alternatively (and equivalently) regions of low interest, and can also adjust the amount of weighting and/or of quantization coarseness to be applied. Other algorithmic fully automatic methods, other than variance, can also be applied to one or more bands at or above the motion-compensated level. For example, a trend of high frequency amplitudes in the band-split hierarchy indicates whether high frequencies are decreasing greatly, decreasing slightly, or not decreasing at levels of increasing spatial resolution. Such a trend usually is indicative of the image detail to be found in higher layers, versus the high frequency noise that is likely to have increasing amplitude at the highest levels (without containing much useful visual detail). Another method (with future cameras creating such metadata) is to use a depth map of the image, combined with information about the lens focal distance, to determine which regions of the image are in focus. Other analytic methods for determining regions of the image which are of interest, and which are in focus, can be utilized to weight the high frequency bands, the SNR difference values, and/or the quantization coarseness/fineness.

Static Enhancement Targets

It is sometimes useful to establish a collection of statically-assigned targets for high-pass layers and/or for SNR layers. For example, layers assigned to enhance the left, center, and right sides of the screen can be always statically targeted. In this way, during decoding, whichever regions are of greatest interest can be decoded, while those of lower interest need not be decoded. In this aspect of the invention, the methods described below allow low overhead for each layer, beyond the data required for the tasks assigned to that layer. Thus, numerous regional enhancement layers (both high-band and/or SNR) can be provided, allowing detailed decoder focusing on specific regional areas. For example, several dozen regions can be enhanced, but perhaps only a half-dozen decoded for those regions of specific interest for a given application.

Similarly, an SNR layer assigned to dark regions and shadows is often useful, such that an interest in the shadow detail can always be optionally decoded by decoding that specific SNR layer. The same approach can be used for SNR layers assigned to bright areas, saturated colors, specific sets of colors, or combinations of these. Similarly, edge-assigned SNR and high-band layers can be utilized for multi-aspect-ratio decoding, such that each screen shape (aspect ratio) can decode those layers appropriate for that shape. The center region of an image, which is common to all intended decoded aspect ratios, can also have various improvement layers.

Figure 7:
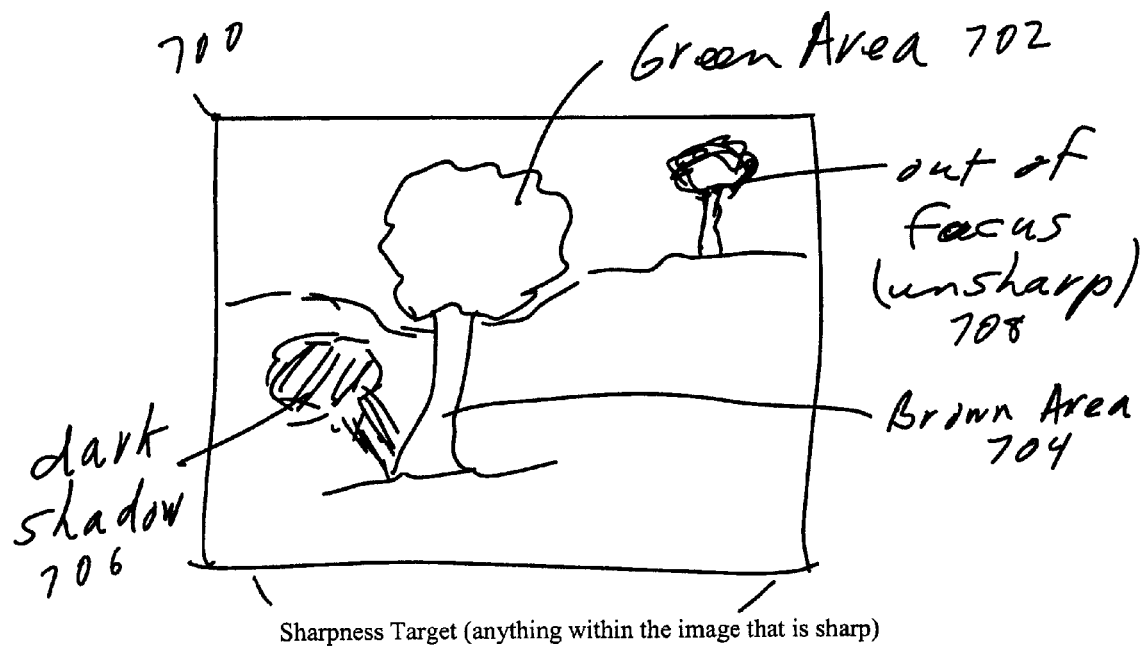
FIG. 7 is a diagram of a source image showing a scene suitable for generating targeted layers.

Combinations of all of these above targets can also be provided in each layer. For example, a layer can target several disparate regions, in addition to dark shadow areas at all points in the picture, in addition to saturated colors in other regions. FIG. 7 is a diagram of a source image 700 showing a scene suitable for generating targeted layers. A tree in the source image 700 has a generally green area 702 and brown area 704 as well as a dark shadow area 706 that can be independently targeted for coding using one or more SNR layers. Since some portions of an image may be out of focus (unsharp) 708, those portions of an image that are in focus (sharp) can be separately targeted for coding using one or more SNR layers. Thus, targeting allows wide flexibility in both encoding and decoding structures to optimize the usefulness of the information provided in the encoded bitstream (or bit files).

SNR Difference-Controlled Quantization

It is common practice to apply a single quantization value to an SNR layer. Larger coded differences (compression coding errors) generate more coded bits than smaller coded errors, in a relatively uniform manner. In those cases where quantization varies by region (usually on "macroblock" boundaries), the common practice is adjustment according to variable rate control to meet a specific target for the number of bits being generated (usually to meet a realtime buffer and delay constraint). Such methods for applying quantization to SNR improvement layers provide limited control over the location and amount of the improvement. Further, there is an assumption that the amount of difference is relatively uniform over the image, or only varies if the quantization is varying for the underlying coding (usually via rate-control for the layers below the SNR layer). However, some coding difference errors are due to concatenated precision errors resulting from quantization during computation (not quantization for compression). In a deeply-layered transform coding system, such as DWT 9/7 subband coding, or deeply-stacked band-split transform coding, concatenated errors can accumulate using floating-point or fixed-point transform processing due to the large number of computational steps. Such computational difference errors add to quantization difference errors at every layer, resulting in a statistical variation of the error, with occasional large errors at several times the standard deviation ("sigma"). In order to reduce such maximum worst-case difference coding errors, improved precision, via decreased quantization, can be applied to the regions containing such errors.

Common practice SNR in image compression uses a uniform quantization. However, in another aspect, the present invention improves the SNR by using a lower quantization value (better precision) for regions of the image showing a higher difference (compression coding error) from the original (for that resolution layer). Typically, the amount of difference varies with each pixel. In this aspect of the invention, the average difference over a region, or the maximum difference over a region, are utilized to control the number of bits generated in that region, directly or indirectly via regional adjustment of the precision of quantization. Combinations of the average and maximum difference can also be used, as well as monotonic functions of these methods. The greater the average, maximum, or other monotonic function of the regional difference, the lower the quantization value should be to apply the greatest correction to that region. In this way, an SNR layer can optionally be weighted to apply most of its bits to the regions of highest compression coding error.

Regional determination of the difference can optionally include filter-kernel-sized edge overlap when analyzing a region, to ensure that all pixels affecting the coding of the region are used to determine the quantization value (even at those pixels beyond the edges of the region, but which affect the region due to filter-kernel-size).

One method of determining the region, in accordance with this aspect of the invention, is to band-split the difference image using DWT 9/7 bi-orthogonal subbands or other band-split filters in a layered hierarchy. After a selectable number of levels, a low-resolution image is created which represents the average of the difference over that region (including edge overlap).

As an alternative or in addition, the maximum difference (compression coding error) of each region can be applied to a resolution hierarchy (including edge overlap) to determine a low resolution quantization value for each region. This maximum can also be implemented as a minimum of the inverse of the compression coding error, or by creating an inverse as a function of the average difference and/or maximum difference. This approach allows precise targeting of SNR improvements to specific regions of the image as a function of the difference (coding error) in each region.

A function of the maximum difference, average difference, or a combined function of both, can be utilized to weight the quantization of SNR difference pixels. Alternatively, and equivalently, the pixel difference values themselves can be regionally weighted. A combination of both regional quantization weighting and pixel weighting can also be used. In either case (quantization and/or pixel weighting), the function of maximum and/or average difference can be set to give a controlled amount of correction to the largest error regions. Usually this is a larger amount of correction. However, it is sometimes useful to apply a uniform amount of correction (not a function of the size of the average and/or maximum difference) which can then be used with a non-linear representation of pixel brightness. There may even be cases where a reduced amount of correction is useful in regions of largest average or maximum error, such that quantization favors more correct regions. More bits often are still applied to the regions of largest difference since those regions continue to generate more bits, even with a higher quantization than other regions (the larger values, even when scaled or divided by the higher quantization, may still generate substantial amounts of bits).

It is common practice to compress a non-linear representation of the light value represented by each pixel. The non-linear representation is usually a gamma-adjusted video signal (with approximately 2.2 gamma being typical). If an SNR difference (coding error) is determined by subtracting the non-linear pixel values from the coded values, an inherent perceptual weighting is implied. Thus, a difference of one pixel unit (one lsb in 8 bits or 10 bits, for example) represents a smaller difference in light value for a dark pixel than for a bright pixel, due to the non-linear representation.

In a YUV representation (also called YPbPr and YCbCr), the U (Pr Cr) and V (PbCb) channels are R-Y and B-Y, respectively. These R and B values are non-linear due to gamma adjustment. However, the R-Y and B-Y values are not perceptually weighted, but are rather weighted by the amount of color (saturation), and are offset to a mid-gray (half of white maximum) value. These U and V channels are thus not weighted perceptually by the gamma function, as is the Y (luminance) signal, or as are the R, G, and B values in coding systems which support direct RGB compression coding.

Thus, in another aspect of this invention, non-linear functions of R, G, and B, or of Y, U, and V, such as gamma or log, can be optionally applied when computing the difference values when creating an SNR layer. The difference values can then be processed using a function of the maximum difference, and or the average difference, knowing that the difference itself is perceptually weighted to be approximately perceptually uniform.

Various alternatives are available to the typical video gamma of approximately 2.2. For example, a different gamma such as 2.6 or 1.8 can be applied. Alternatively, a pure-logarithmic or a quasi-logarithmic non-linear representation can be used to determine the difference (coding error) in a perceptually uniform manner for a given application. Other non-linear perceptually uniform representations can also be used, according to this invention, as described here.

Note that the use of floating-point representation for pixels and processing, including the quantization value, regional quantization value, and/or scaled pixel values, allows precise control of these SNR weighting processes.

Relationship of SNR and Resolution Layers to Motion Compensation

As with SNR layers, motion compensation is intended to be applied to specific layers, usually at medium to high resolution. Motion compensation, in general, is the displacement of a region (usually rectangular or square) according to a motion vector (or more than one motion vector, in the case of "B" frames), from a previous (or subsequent) frame, for subtraction with a region in the current frame.

The motion compensated difference can then be band-split, quantized, and variable-length-coded, as with intra (i.e. non-motion-compensated) frames. It is a property of motion compensation that decoding is applied up to the base motion compensation resolution. Thus, no lower resolution decoding is available. Additional motion compensation can be applied at increased resolutions, but all layers beyond the motion compensation level require the full decoding of the resolution at which the base motion compensation is applied.

Note that SNR layers can be applied at any level at or below the base motion compensation resolution. SNR and resolution-increasing layers can then be applied at or above the base motion compensation resolution. However, only those SNR and resolution-increasing layers at or above the base motion compensation resolution are optional. All SNR and resolution levels at or below the base motion compensation resolution are required for every motion-compensated frame. This aspect of the invention is seen in FIG. 6, as described above.

Quantization as a Function of Layer

JPEG-2000 allows quantization to be specified for each subband layer. Another aspect of this invention is to improve layered transform quantization by utilizing finer overall quantization (by using lower quantization parameter values) at lower resolution levels, in conjunction with regional quantization scaling. Since the lower levels are at a lower resolution, each pixel in a lower level affects a number of pixels in higher layers. In a deeply-layered band-split transform coding system, a pixel in a lower resolution layer can affect many pixels in the higher resolution layers. There is also propagation of influence at each layer due to the size of the filter kernels (which are 9 or 7 taps in the DWT 9/7 system, but which may have any useful size between two and dozens of taps). Thus, with each layer of increasing resolution, the influence of a pixel at a low resolution may propagate over an ever-widening and ever-heightening region.

In addition, the low-pass filter structure of band-split transforms in general, and of the DWT 9/7 subband transform in particular, result in reduced noise at each lower resolution level. This is due to the statistical reduction of noise which occurs when an image is low-pass filtered. The lower resolution layers should thus optimally be coded with higher precision (via a lower quantization parameter), due not only to the large regional influence, but due also to the higher signal-to-noise inherent in the lower resolution image.

It is thus beneficial to optionally increase the precision of quantization, via using an overall quantization parameter which becomes smaller at each lower resolution level during the band splitting transform coded quantization, in conjunction with regional quantization scaling.

Meeting Quality Targets

Using the tools described above, it is possible to statistically bound the coding errors during image compression. The nature of computational quantization as well as image transform quantization, yield a statistical variation in the accuracy of the coded result. However, using difference-controlled SNR layers, those regions having lower accuracy can be specifically targeted for accuracy improvement. In this way, nearly all of the pixel values can be brought within any defined error difference bound. This can be so effective that only a few pixels out of millions may exceed this bound. It is then a simple matter to specify the location of these few pixels, and the delta to apply to bring them to the intended value. In this way, every pixel within the decoded image can be brought within any desired error bound.

The most useful method of determining the useful error bound is to take statistics on the noise characteristics of the image. The noise generally is a function of brightness, and often of color as well. Once the noise floor is determined, for each frame, the error bound can be established. In general, some high-noise images contain useful picture detail at a level below the noise floor. For such images, the noise bound could be usefully set to lower than the noise floor in order to preserve this sub-noise-floor picture detail. For low noise images, the noise floor itself is likely to be a useful bound. When using a camera as a high-accuracy sensor of the real world, using this methodology allows confidence that the compression system is preserving all of the information provided by the sensor. This is important for some applications, where the highest quality image is needed.

In addition to the full quality of image sensors or film-based image scans, it is also often useful to provide lower quality images at a higher compression ratio (less bits). Using the methodologies described here, lower quality layers can be provided which meet the need for higher compression ratio, as well as additional layers which, when combined with the lower quality layers, provide the entire quality available in the original image. In this way, the coding system can create all of the data necessary to fully reproduce the original image, while having lower quality layers which simultaneously allow higher compression. Further, the higher compression layers contribute to the full quality layers, such that little or no data is wasted. In some cases, such a layered structure is actually more efficient. This is especially true of this invention, since the per-layer overhead has been intentionally minimized to allow numerous layers with high efficiency.

Noise Characterization

As mentioned above, it is useful to have a characterization of the noise floor of a still or moving image as a function of brightness and color. This can be easily accomplished using a color and grayscale chart, if one was photographed and adjusted along with the rest of the scene (usually at the start of the scene). Such a chart usually contains squares of uniform colors and brightnesses. Each such square can then be used to determine the variation of one pixel to adjacent pixels (horizontally, vertically, and diagonally), since all pixels should see the same brightness and colors within the uniform square. Further, one frame to the next can be compared over a number of frames, to determine variations with each frame, since each frame should also see the same color within each square. In this way, the frame-to-frame (temporal) noise, and the pixel-to-pixel (spatial) noise in the original image can be directly observed for each color and brightness square.

In addition to these basic premises, there are a number of practical considerations with respect to characterization of imaging systems.

If the chart is in focus, and dust or scratches are present on the squares of color and brightness, there are unwanted variations. It is thus beneficial to slightly defocus the chart, to reduce these dust and scratch effects, as well as to reduce variations in the colored and gray squares themselves, which may use textured paint having inherent areal variation.

Another practical issue involves silicon image sensors. For silicon sensors, and other types of electronic image sensors, it is common to have manufacturing variation in pixel sensitivity for each pixel location. This is called "fixed pattern noise", since the variation does not move or change because it is attached to each pixel. Such noise is not affected by whether the image is in focus, but is more easily revealed if the image is not in focus. It is best to average captured images over a number of frames in order to determine the fixed pattern noise at each pixel at each brightness. This can be done by imaging a set of full-frame colors and brightnesses, or by any other method of ensuring that each pixel location is tested at all brightness levels to which the sensor is responsive. The average thus determined can then be removed from every original image generated by that specific sensor by appropriate computation, such as subtraction.

Note that fixed pattern noise is interferes with motion-compensation, since the image is moving but the fixed pattern is not. Thus, it is another beneficial aspect of this invention to remove fixed-pattern noise, when such characterization is possible, prior to motion-compensated compression.

Another version of fixed-pattern-noise occurs with digitally-scanned film. The sensor is usually an area array, with identical fixed-pattern-noise issues to electronic cameras, or alternatively a scanned line-array. In the case of the line array, the fixed-pattern-noise appears as vertical or horizontal stripes (depending on the direction of scan). Again, it is beneficial to characterize and remove such noise prior to motion-compensated compression.

The removal of fixed pattern noise is also beneficial for high precision intra (non-motion-compensated) compression, since the noise stripes or pixel pattern require coding bits, but do not represent image information. It should be noted that digital cameras, area array, and line array scanners typical apply some correction to reduce the amount of fixed pattern noise. Thus, the discussion here applies to the remaining uncorrected fixed pattern noise.

Note that film perforation registration is imprecise, and differential film shrinkage occurs. Scanned film therefore exhibits "gate weave" and other motion variations not inherent in the original image. Such distortions and unwanted motions are treated as image motion by the present invention, and the removal of these distortions and unwanted motions is the subject of known techniques. If such distortions and unwanted motions are removed, the resulting image more closely matches the original image in steadiness and actual motion, assuming that the algorithms applied function properly. Note, however, that the processes which attempt to restore the correct motion to the film image also move and alter the fixed pattern noise, making its removal impossible. Thus, another aspect of this invention is the process whereby fixed pattern noise is reduced or removed before using other technologies to steady the scanned film image, prior to compression with this invention.

Another practical problem occurs due to lens flare, where bright regions of the image "spill" into darker regions. This problem can be eliminated by the use of full-frames of color and/or brightness. The problem can be reduced by imaging a multi-color, multi-brightness chart using known "flare correction" techniques which attempt to model the lens flare of a given lens, and then subtracting out the resulting brightness and color interference due to that len's flare.

Full Range Low Bands

Another aspect of this invention is the use of one or more full-range low bands, meaning that at least the lowest band of a band-split hierarchy utilizes floating-point representation to provide wide-range and high precision. All higher bands can be coded with quantized integers, which are decoded using dequantized floating point values which form high bands for the synthesis of higher resolution bands. The use of OpenExr half 16-bit floating point representation provides a relatively compact way of directly storing these low bands, taking advantage of the internal lossless "Piz" compression (Huffman, cluster-table, Haar-wavelet).

In the case of motion compensation, this floating point low band represents the low band of the difference image after motion compensation, and is thus inherently signed, even for all-positive pixels.

Note that a common quantization artifact of smoothly-varying low-noise image regions is contour-banding due to quantization. This contouring artifact is eliminated by the use of high precision floating-point (or fixed point) representation for the lowest image pixel band, since precise fine gradients are essentially exactly reproduced. One way to conceive of this novel approach is to consider that the lowest band is not quantized at all, but is rather kept at very high precision. Since the resolution of this lowest layer can be fairly low, the overall compression ratio can still be relatively high, even though the low band is being represented at high precision.

In addition to storing a low band of the intra or motion compensated image, quantization can also be controlled regionally by using a low resolution floating-point quantization image. Such an image can be created using the low bands of a band-split hierarchy, or it can be created using minima, maxima, or any other of the criteria described in this invention. The resolution of the quantization image data need not match any band-split image resolution, but rather only need be described in terms of the mapping to be used when applying the quantization values to pixels in their corresponding region at each resolution level.

Since the quantization parameter need not have fine gradations to be useful, most of the benefit of using a floating point representation's wide range can still be retained if low-order mantissa bits are masked off. This has little affect on the image quality, but allows the clustering in the cluster-table of Piz OpenExr compression to yield good compression. A few bits of mantissa, allowing four to eight quantization code steps per factor of two, retains fine quantization steps while allowing good Piz OpenExr compression.

While the discussion here has used Piz compression and OpenExr as an example implementation, other floating-point systems, or other wide-range scaled fixed-point systems, and similar compression systems, can also be used with this invention. One novel concept of this invention is the use of a wide-range quantization image to regionally control quantization. Another novel concept is the use of a wide-range low band with high precision representation, such as with a floating point representation.

Yet another aspect of this invention is the use of alternate quantization control images for SNR bands and other high resolution enhancing bands. The use of targeted SNR features can optionally utilize alternate quantization images, of varying useful resolutions, to regionally determine quantization parameters. One or more such additional quantization images can be used in conjunction with one or more SNR or high-band resolution layers, as appropriate. The quantization images provide a means to target specific features to be decoded more finely, thereby placing SNR improvements or resolution-increasing detail in the most desirable locations.

Another way of obtaining wide dynamic range using low bands according to this aspect of the invention is to utilize the quantized integers of common practice, but to use a floating-point representation for the quantize/dequantize parameter. The floating point quantization parameter then allows wide-range coding. For motion compensated coding, the range of floating point representation may only be needed on intra frame quantization parameters, since the range of motion-compensated differences is small, even when the frames all have a wide range. Thus, an integer quantization parameter can be optionally used at any and all layers, including the lowest, when using motion compensation, since wide range can be enabled entirely by a floating point quantization parameter for the low intra band. Such a floating point quantization parameter may be regionally applied at the resolution of its layer or at a lower resolution, or a single value may be used for the entire layer, if appropriate. Thus, this invention allows a mixture of integer and floating point lowest band pixels in intra and motion compensated frames, together with a mixture of floating point and fixed point quantization parameters, both regional and per-layer. The system of this invention is being utilized as long as at least one low-band quantization parameter and one low-band pixel image uses floating point representation.

Noise Dithering Prior to Quantization

When truncating to a lower number of bits, dithering is the process of adding noise in order to reduce the visibility of adjacent brightness steps. When the actual image noise floor at each resolution layer is utilized to establish overall and/or regional quantization, the noise floor itself properly dithers the image pixel values prior to quantization.

As another optional aspect of this invention, however, if a coarser quantization is used at one or more required or optional layers (for higher compression at those layers), then it sometimes is beneficial to dither the pixel values with pseudo-random noise prior to quantization. The sum of the added noise and the inherent noise should equal the quantization step size. The use of the floating point quantization parameter of this invention is beneficial for precise control of such dithering.

If an optional deadband is used around zero, then there are several optional treatments within the deadband. One treatment would add noise at a level corresponding to all other band steps (i.e., those outside the deadband). This treatment would preserve the function of the deadband, but dither some values to integer plus-or-minus one which would otherwise have been rounded to zero within the deadband. Another treatment is to add noise to values which would not be within the deadband without dithering. Thus, the compression benefit of the deadband would remain unaffected. Another treatment is to utilize dithering the size of the deadband, by adding half of the amount of the deadband's extent between zero and the point where the deadband value is exceeded (which generates an integer one). Note that the sign of the transformed pixel value is taken into account, such that half the deadband is subtracted from negative values in this treatment. Other treatments, as combinations of the above, or as a function of quantized amount, are also potentially useful.

Note that low bands and high bands can be optionally selected for noise dithering, and the dithering level for each can differ. Dithering generally increases the compressed bit-size, and thus the amount of dithering is a tradeoff between image quality benefit and compression efficiency. Thus, it is sometimes be useful to have the sum of the inherent local image noise and the added pseudo-random noise be less than the quantization stepsize, in order to reduce output bit-size somewhat, while gaining some of the benefit of dithering.

Note also that low bands of optional SNR layers are likely to benefit from different noise dithering treatments than optional SNR high bands. Further, optional SNR and resolution-enhancing bands may find different dithering amounts useful, as well as no dithering, as a function of the band characteristics. Further, required resolution-enhancing high bands, if quantized at a level above their noise floor, may benefit from specific but differing (as a function of particular level) amounts of dithering, and specific deadband treatments.

If information about the noise floor of a moving image and its regions is not available, a generic guess of the overall image noise floor can be used to help select the amount of dithering to apply when using quantization parameters likely to substantially exceed the generic noise floor guess.

As noted above with respect to this invention, the quantization parameter is generally the multiplicative product of the overall quantization and the local region quantization scale, for each layer. Further, the image noise floor generally decreases with each lower-resolution band, with a correspondingly finer (lower) quantization parameter. Such quantization is sometimes targeted to focus bits at specific features within the image at higher optional layers. The lowest layer uses high precision floating point, having a precision set to exceed even the very lowest noise floor image sources, including many layers of low pass filtering, such that the lowest band itself is never quantized above the noise floor. Only bands above the lowest level (both high and low bands) are candidates for pseudo-random noise dithering as described here.

Adaptive Lossless Coding by Region

Once integers are obtained by dividing the quantization parameter into the band-split-transformed pixel value, they are efficiently coded in a lossless (bit-exact) manner. Common practice uses a single variable-length coding ("vlc") table such as Huffman or Arithmetic coding. With Huffman coding, each value is coded separately. With Arithmetic coding, multiple values are coded together. It is also common practice to extend a simple static table to multiple static tables, each for different purposes. Further, there exists a practice of "adaptive" variable length coding, where several tables are available, and the most efficient one can be chosen and signaled to the decoder. It is also possible to send a table from the encoder to the decoder, based upon a specific efficient coding for that data. These adaptive and signaled practices are not common, but they have been utilized, sometimes with a reasonable compression efficiency gain.

A companion to these variable-length coding practices is their application to specific transform coding regions. For example, JPEG-2000 uses the entire image at each resolution band. Also, for example, MPEG-1, MPEG-2 and MPEG-4 (both parts 2 and 10) code their integer DCT values using a choice of several patterns (e.g., scan or zig-zag), corresponding to each DCT block (e.g., 4×4, 8×8, 8×4, 16×16 pixels).

It is another novel aspect of this invention that the lossless variable-length coding of band-split transform pixel coefficients are coded using adaptive regions. These regions can have arbitrary size and shape, and are selected solely on lossless coding efficiency (i.e., minimum bit-size). The size and shape of these regions is not limited to any particular size and shape, unlike previous vlc coding methods. In this aspect of the invention, a number of "vlc" tables are available which are tested against all selected region sizes and shapes. Further, downloadable vlc tables can be utilized. For each selected region size and shape, all of the statically-available vlc tables are tested for bit-size. The size, shape, and vlc table which has the smallest bit-size are then signaled to the decoder.

Downloadable vlc tables can also be tested, usually in conjunction with specific data patterns which benefit from vlc tables which optimize these data patterns. Note that such downloadable vlc tables can be created algorithmically, driven by the specifics of the data pattern. If such a downloadable pattern, at a specific size and shape, utilizes the smallest bit-size, including the amortized table download size, then such a table is optionally be selected as most efficient.

While there are no restrictions on the size and shape of the vlc-lossless coding regions used in this aspect of the invention, simple rectangular regions are easiest to implement.

Note that a wide range of region sizes, from as small as 2×2 (or 1×1) to as large as 128×128 (or even larger), may be utilized to fully automate a wide range of data. Also, extreme rectangular shapes such as 2×128 and 128×2 is also sometimes optimal, as well as any shape in-between, or sometimes even more extreme shapes.

For example, the SNR layers describe above, which target specific features, may encounter large regions where only sparse data is needed. For such large regions, the ability to adapt the region sizes and shapes (using the best vlc for that region) to the need for coded data in those regions greatly reduces the bit-coding overhead of high-resolution SNR layers. Using this aspect of the invention, many SNR layers can be applied, even at very high resolution (such as 4 k resolution) with only a small bit-size overhead for having such layers in regions in which they are not actively targeting image improvement. Further, if such an SNR layer finds little "work" to do, meaning when none of the targeted image data is present, then there is little overhead for having the layer present. This is a significant benefit to this adaptive region size, shape, and vlc selection method.

It is beneficial to target certain vlc coding tables to optimize for large regions of zero using a small number of bits for the region. It is also beneficial to code transformed pixels individually, or in groups, where the maximum values are limited to a small range, such as ±1 or ±2. When a vlc is available which is limited to coding a small range, the range of values for the region can be simply tested via max and min, and that vlc code need not be measured for that size and shape if the pixel values are beyond its range. Further, if all the values are zero in a specific region size and shape, the zero coding is optimal, so no other vlc tables need be tested. In this way, an exhaustive optimum for minimum bit-size can be determined without requiring all vlc codings to be calculated, since some codings can be simply eliminated.

Near the edges of the image, the coding region sizes and shapes are naturally restricted. Further, when vlc tables are available which combine multiple pixels in a common code value, such vlc table options cannot be considered if the available size at the edge does not fit.

While an optimized exhaustive method of trying all region sizes, shapes, and vlc options is described, it is also useful as an encoding speed optimization to test only a subset of the remaining sizes, shapes, and vlc tables, based upon a sparse scan of the data to be coded. Using a best-guess of which sizes, shapes, and vlc tables best fit the sparse sampling, only those sizes, shapes, and vlc tables need be tested, eliminating the computations required to test all cases, even with the optimizations described in the previous paragraph. For example, in addition to the maximum and minimum, the average and the average deviation, standard deviation, or other statistical characterization can be utilized to guess which vlc tables have the best chance of being optimal. Further, such statistical characterization can also eliminate some vlc choices as being most likely to require more bits. Further, some region sizes and shapes can also be eliminated and others favored for some statistical characterizations. For example, sparse data is more likely to benefit from large regions, whereas dense data is most likely to benefit from small regions, since the vlc's for each region can be independently optimized.

Using these methods of optimizing the choice of region size, shape, and vlc, only a small subset of choices need be tested during encoding, thus approaching the minimum bit-size obtainable from exhaustive testing while reducing computation time.

Note that the adaptive use of coding region size, shape, and vlc need bear no relationship between one resolution layer and another, so that each layer can be optimized independently of the others. Since this aspect of this invention involves lossless bit-exact coding of integers (the integers result from the quantization division, fixed, or float), there is no effect on the visible image from the adaptive size, shape, and vlc table method described here. The use of adaptive coding region size and shape in conjunction with a choice of vlc tables is exclusively an optimization to minimizing the bit-size of the lossless coding of aspects of the image, most notably the bandsplit-transform-coded pixels which form the bulk of image data. This aspect of the invention does not affect integer values of the compression data nor the compression quality, only the variable-length-coded bit-size of that data.

This adaptive lossless integer-coding method can also be applied to integer quantization parameter sub-images, in the case where quantization is regionally controlled by a low-resolution sub-image. Another aspect of the invention applies adaptive coding region size, shape, and vlc tables to low resolution floating-point low bands or floating-point regional quantization images. In this way, floating-point low bands and quantization bands can be regionally grouped into regions of similar exponent. In conjunction with quantization mantissa truncation to a few bits, such regional size, shape, and vlc coding can be highly effective in coding regional low-resolution quantization floating point values. For low image bands of intra frames, the adaptive size, shape, and vlc tables can also be beneficial, especially for the exponent and sign, although the higher required mantissa bit precision inherently limits the amount of mantissa bit-size reduction achieved (unless mantissa precision is reduced when a high noise floor at that low band allows such reduction without reducing image quality).

Layered File Structure

Another aspect of this invention is the use of a file structure for the layers of bits. Each resolution layer, each SNR layer, each floating-point lowest band, each quantization regional low band, and the motion compensation form different aspects of the bits generated during compression. It has proven convenient to organize the compressed bits into files, with one file for each frame for each aspect of that frame. Each aspect is further placed in a folder dedicated to that aspect. The overall project or scene contains all of these aspect folders within a highest-level folder or storage device (such as a recordable digital disk like DVD-R or CD-R).

In addition, at the start of each sequence (typically a scene), as well as at optional convenient subsequent frames, a header file can be stored. The header file contains typical header information or metadata, such as the number of frames, the distance between intra frames (if motion compensation is active, or a distance of "one" to deactivate motion compensation), the resolution of each layer, the presence or absence of each optional layer, the overall quantization values for each layer present, the size of the deadband for each layer, and other required per-sequence information. It is usual to include a header file when inserting intra-frames at less frame distance than a specified "intra-stride" parameter value.

FIG. 8 is a diagram showing one possible layered file structure in accordance with this aspect of the invention. Each entry in the example shown is in the form of a type identifier ("Folder" or "File") and an item name (e.g., "low-low_floating_point"); however, in implementation, the type identifier generally is implicit in the directory structure of a computer file system. In this example, a root folder 800 includes one or more header files 802 as described above, and then a series of folder 804 representing a separable aspect of the compressed image sequence. Each folder 804 contains files 806 that contain the actual bits corresponding to each frame of the specific separable aspect of the compressed image sequence represented by the folder structure.

This folder and file organization has proven convenient in a number of ways. It is easy to select some layers, and not others, by only copying those folders containing the desired layers (as long as they provide sufficiency for decoding at the desired level). Those folders containing layers which are beyond the current need not be copied nor transmitted. At encoding and decoding time, it becomes simple to automatically generate the folder and file names from the aspect and frame number.

This intermediate folder-per-aspect and file-per-frame-per-aspect structure provides a convenient way to manage the many layers that are a feature of this invention.

This intermediate folder and file structure can also be read by a transmission processing code which can assemble the desired number of layers into a typical compressed moving image stream multiplex. The multiplex need only concatenate the bits from the per-frame files within the aspect folders, with a simple header to indicate which aspect block follows, and the length of that block of data. The selected multiplex may be transmitted, or it may be stored, as with MPEG-2 and other common moving image compression systems.

It is straightforward for the decoder to decode the multiplex. Alternatively, the flexible intermediate aspect folder and file structure can be reconstructed from the stored or transmitted multiplexed bitstream using a corresponding demultiplex processing code. Such demultiplex code can reconstruct the aspect folder and file structure from all of the layers and aspects which were included in the multiplex, or may optionally omit reconstruction of some optional aspects which are not needed.

Automated Intra Selection

There have been numerous methods to decide when to insert an extra intra-frame into a sequence, usually by looking for a scene cut by examining the pixels of adjacent frames. In this aspect of the invention, an optional method of inserting new intra frames is to count the number of bits needed for a motion compensated frame. If that number is not at least a reasonable percent less than the bits needed for the previous intra frame, then the motion-compensated frame can be discarded and an intra frame can be made. For example, an intra-insert can be selected if the motion compensated frame does not use at least 5% fewer bits (or any other useful amount, as specified by an adjustable parameter). Further, if desirable, a motion compensated frame compressed bit-size can be allowed which is larger than the previous intra frame bit-size by a specified amount.

Note that motion compensation has overhead for motion vectors and motion modes. When frames are significantly different, the motion compensation overhead may cause the motion compensated frame to actually be larger than the previous intra frame. Some other common cases, where the amount of data is very small, such as a fade-up from black, may result in motion compensation overhead that is a large portion of the data in each frame, and accordingly may automatically select an intra-insert for every frame during the fade-up, solely based upon a comparison of the number of bits. For this purpose, the number of bits of all coded layers can be used, or alternatively, the number of bits up to a lower useful layer (excluding one or more optional higher resolution and SNR layers).

Note that the intra-coding of the current frame need not create the same number of bits as the previous reference intra frame. Thus, the choice of a percentage (or alternatively, an absolute amount) difference is beneficial when comparing between the motion compensated compressed bit-size of the current frame and the previous intra frame (which may be many frames previous). The selection of the percentage (or other) difference amount can be altered to match the intra-frame stride distance and the type of scene being compressed, in order to optimize the use of this automatic intra-frame insert.

This simple bit-size comparison method has proven highly-effective in optimizing the quality and reducing the number of coded bits during high scene change, fade-up, and other special cases.

Implementation

Figure 9:
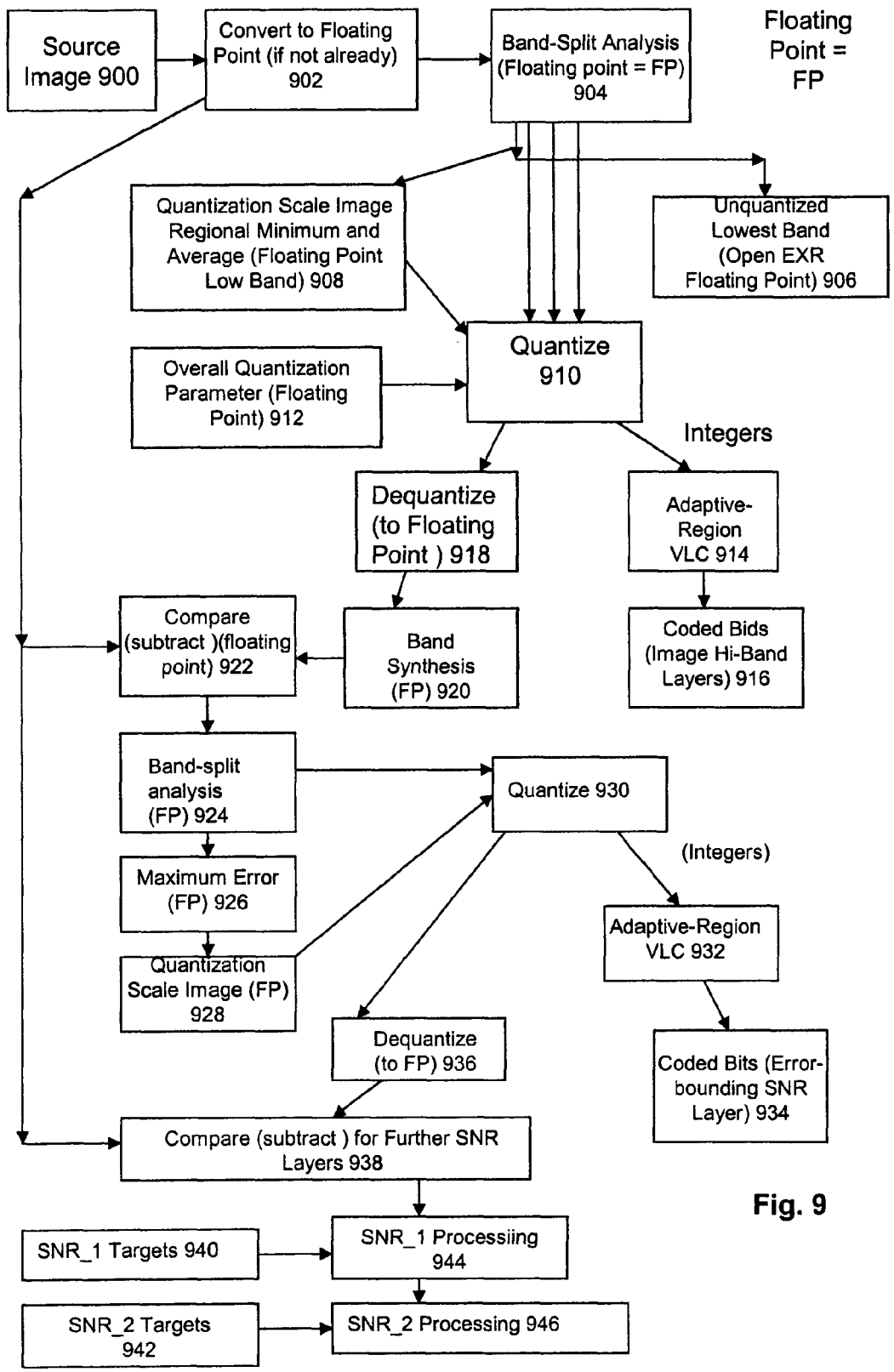
FIG. 9 is a block diagram showing one implementation of various aspects of the invention in a non-motion compensated compression/decompression system.

FIG. 9 is a block diagram showing one implementation of various aspects of the invention in a non-motion compensated compression/decompression system. Various stages of this implementation are optional, and other optional stages or steps may be included. A source image 900 is converted to a floating point representation 902 (if not already in that format). The floating-point image 902 is subjected to a band-split analysis 904 having a floating point output. The resulting unquantized lowest band 906 may be directly output in a floating point representation, such as the OpenExr format, as the lowest layer of the compressed source image.

One or more of the remaining bands may be quantization scaled 908 by taking into account regional minimum and average pixel values. Each selected band-split image is then quantized 910 using an overall quantization parameter 912 and a regional quantization scale image 908, with all quantization parameters and quantization scales preferably represented in floating point format. The integer output of the quantizer 910 can then be coded using an adaptive-region VLC code 914 and output as coded bits 916 representing the high-band layers of the compressed source image.

To generate SNR layers, the output of the quantizer 910 is dequantized 918 to a floating point representation and up-filtered by a band synthesis filter 920. The output of the band synthesis filter 920 is subtracted 922 from the floating point source image 902 and subjected to a band-split analysis 924. The maximum error 926 for the output of that analysis can then be determined and used to generate quantization scale image 928. The quantization scale image 928 is used to regionally scale quantzation of the output of the band-split analysis 924 through a quantizer 930, coded using an adaptive-region VLC code 932, and output as coded bits 934 representing an error-bounded SNR layer.

The output of the quantizer 930 may be dequantized 936 to a floating point representation and subtracted 938 from the source image 900 to be used with one or more SNR targets 940, 942 to generate corresponding SNR difference images 944, 946 as shown in FIG. 6.

The invention may be implemented in hardware or software, or a combination of both (e.g., programmable logic arrays). Unless otherwise specified, the algorithms included as part of the invention are not inherently related to any particular computer or other apparatus. In particular, various general purpose machines may be used with programs written in accordance with the teachings herein, or it may be more convenient to construct more specialized apparatus (e.g., integrated circuits) to perform particular functions. Thus, the invention may be implemented in one or more computer programs executing on one or more programmable computer systems each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such program may be implemented in any desired computer language (including machine, assembly, or high level procedural, logical, or object oriented programming languages) to communicate with a computer system. In any case, the language may be a compiled or interpreted language.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

Novel and useful aspects of the invention include at least the following:

(1) Use of a different quantization parameter value at two or more resolution levels of a coding transform resolution hierarchy, including use of reduced-resolution levels of a band-split or band-split hierarchy as regional scaling for quantization.

(a) Optionally applied to the bi-orthogonal subband 9/7 Discrete Wavelet Transform resolution hierarchy.

(b) Optionally applied to a more optimal band-split hierarchy.

(c) Optionally including a minimum and/or maximum on the reduced-resolution quantization scale, optionally as a function of each resolution level.

(2) Use of a floating-point quantization parameter value in conjunction with integer or floating point reduced-resolution levels of a band-split or band-split hierarchy as regional scaling for the floating-point quantization.

(3) Use of high precision, such as floating-point or half-floating-point, for a low resolution level of a coding transform hierarchy.

(a) Optionally including the bi-orthogonal subband 9/7 Discrete Wavelet Transform resolution hierarchy.

(4) Use of floating point everywhere in an image compression coding between input (pixel input is optionally integer), up to the point of the quantization divide (after which coding is bit-exact lossless). Thus, all transform processing is performed in floating point.

(5) Similar use in the decoder of floating point everywhere, after the dequantization multiply, up to the final pixel values (which may be optionally converted to integers as a final step).

(6) Use of actual image (intra-style) low bands for quantization, but applying quantization not only to intra-coding, but also (when motion compensated) to motion-compensated difference bands (including bands at different levels, higher and/or lower, of the band-split hierarchy).

(7) Use of a resolution hierarchy, wherein the minimum value is taken for a suitable low-low band, for use as a scale factor for the quantization parameter for all pixels at higher resolution levels;

(a) Optionally including use of specific minimum and/or maximum values, optionally as a function of each resolution level.

(b) Optionally including adjacent pixel overlap at each level, to take into account the influence of the band-split filter extent.

(8) Use of resulting coding error difference values to create a new suitable low-low band for use in weighting quantization for an SNR correction layer such that larger errors have smaller quantization parameter values (thus higher number of correction bits generated).

(a) Optionally including adjacent pixel overlap at each level, to take into account the influence of the band-split filter extent.

(b) Optionally including an additional quantization weighting as a function of the amount of factor that a given pixel's error is above the average error (9) Use of a different deadband quantization zone at two or more resolution levels of a coding transform resolution hierarchy.

(a) Optionally applied to the bi-orthogonal subband 9/7 Discrete Wavelet Transform resolution hierarchy.

(10) Use of noise dithering at the point of quantization, with the noise level being set at the quantization stepsize or smaller. When set smaller, the goal is for the sum of the inherent image noise (at that level) plus the added noise, to equal the quantization step. The deadband (around zero) noise dithering may optionally be treated differently than other steps.

(11) Use of a statistical numeric characterization, such as a transform amplitude histogram as a function of one or more of color, brightness, and region for one or more SNR layers in order to reproduce the appearance of film grain or camera noise.

(12) Use of the count of bits generated by a motion compensated frame, in relative comparison to the count of bits within the previous intra frame, to determine whether to recompute the motion compensated frame as an intra frame instead.

(13) Use of adaptive region sizes to optimize for minimum bits when lossless bit coding using one or more choices of variable-length coding tables.

(14) Use of an optional intermediate file folder structure to group compressed data components for various layers.

A number of embodiments of the invention have been described. Nevertheless, it is understood that various modifications may be made without departing from the spirit and scope of the invention. For example, some of the steps described above may be order independent, and thus can be performed in an order different from that described. Accordingly, other embodiments are within the scope of the following claims.

The invention claimed is:

1. A computer-implemented method for compressing a sequence of digitized video images represented as pixels utilizing signal-to-noise improvement layers, the method being implemented in a computer system comprising one or more physical processors, the method comprising:

generating at least one processed image layer from at least one of the sequence of digitized video images, each processed image layer comprising a plurality of values representing a coded image layer; and generating a plurality of signal-to-noise layers, each signal-to-noise layer being derived from a corresponding coded image layer, wherein at least one such signal-to-noise layer is targeted to improving the quality of a selected specific feature of the corresponding coded image layer.

2. The method of claim 1, wherein at least one generated processed image layer is a band-split layer.

3. The method of claim 1, further including encoding at least one generated processed image layer by preferentially allocating coding bits to regions of interest in such at least one generated processed image layer by decreasing the amplitude of pixel differences near edges of the corresponding digitized video image using a weighting which decreases as a function of nearness to such image edges.

4. The method of claim 1, wherein generating at least one processed image layer includes applying a filter structure to generate a hierarchy of reduced resolution layers from one of the sequence of digitized video images.

5. The method of claim 4, further including generating at least one signal-to-noise layer corresponding to at least one of the hierarchy of reduced resolution layers.

6. The method of claim 1, wherein the pixels of the sequence of digitized video images have values representing different colors within a color space, and further including:
   generating at least one processed image layer by applying a non-linear function to each color value of the pixels of at least one of the sequence of digitized video images to create a perceptually weighted image; and
   generating a signal-to-noise layer from each perceptually weighted image.

7. The method of claim 6, wherein the non-linear function is a gamma function.

8. The method of claim 6, wherein the non-linear function is a log function.

9. A computer-implemented method for compressing a sequence of digitized video images represented as pixels utilizing signal-to-noise improvement layers, the method being implemented in a computer system comprising one or more physical processors, the method comprising:
   generating at least one processed image layer from at least one of the sequence of digitized video images, wherein each processed image layer comprises a plurality of values representing one of a coded image layer or a signal-to-noise layer derived from a coded image layer; and
   encoding at least one generated processed image layer by preferentially allocating coding bits to regions of interest in such generated processed image layer by decreasing the amplitude of pixel differences near edges of the corresponding digitized video image using a weighting which decreases as a function of nearness to such image edges.

10. The method of claim 9, wherein generating at least one processed image layer includes applying a filter structure to generate a hierarchy of reduced resolution layers from one of the sequence of digitized video images.

11. The method of claim 10, further including generating at least one signal-to-noise layer, each such signal-to-noise layer corresponding to one of the hierarchy of reduced resolution layers.

12. The method of claim 9, wherein the pixels of the sequence of digitized video images have values representing different colors within a color space, and wherein generating at least one processed image layer includes:
   applying a non-linear function to each color value of the pixels of at least one of the sequence of digitized video images to create a perceptually weighted image; and
   generating a signal-to-noise layer from each perceptually weighted image.

13. The method of claim 12, wherein the non-linear function is a gamma function.

14. The method of claim 12, wherein the non-linear function is a log function.

15. The method of claim 9, wherein at least one generated processed image layer is a band-split layer.

\* \* \* \* \*